United States Patent [19]

Watanabe et al.

[11] Patent Number: 5,619,134
[45] Date of Patent: Apr. 8, 1997

[54] PHYSICAL QUANTITY DETECTING DEVICE USING INTERPOLATION TO PROVIDE HIGHLY PRECISE AND ACCURATE MEASUREMENTS

[75] Inventors: Takamoto Watanabe, Nagoya; Yasuaki Makino, Okazaki, both of Japan

[73] Assignee: Nippondenso Co., Ltd., Kariya, Japan

[21] Appl. No.: 393,563

[22] Filed: Feb. 23, 1995

[30] Foreign Application Priority Data

Feb. 25, 1994 [JP] Japan .................................. 6-028358

[51] Int. Cl.⁶ .......................... G01R 33/00; G01R 33/02; H01L 43/08; G01B 7/00
[52] U.S. Cl. ............... 324/225; 324/207.12; 324/207.21; 324/252
[58] Field of Search .......................... 324/207.11, 207.12, 324/207.21, 207.25, 252, 174, 225, 233, 235, 236

[56] References Cited

U.S. PATENT DOCUMENTS 5,086,475  2/1992  Kutaragi et al. .
5,128,624  7/1992  Hoshino et al. .
5,134,371  7/1992  Watanabe et al. .
5,142,226  8/1992  Sakamoto et al. ................ 324/207.24
5,289,135  2/1994  Hoshino et al. .

FOREIGN PATENT DOCUMENTS 63-296511  12/1988  Japan .

*Primary Examiner*—Walter E. Snow
*Attorney, Agent, or Firm*—Cushman, Darby & Cushman

[57] ABSTRACT

In a physical quantity detecting device for converting a physical quantity into changes in the cycle of a pulse signal and for amplifying the cycle to convert it into digital data, detecting accuracy is improved by increasing the sampling frequency without reducing the degree of the amplification of the cycle of the signal. In a physical quantity detecting device wherein pulse signals having oscillation frequencies changing depending on the ambient strength of magnetism are output from oscillators and wherein the cycles of the pulse signals are amplified by counters and decoder portions and are input to a pulse phase difference encoding circuit to convert the phase difference into digital data, the digital data is interpolated using the pulse signal from one of the oscillators as a sampling signal. This makes it possible to interpolate the digital data to accurately detect the strength of magnetism without providing a special oscillation device for inputting a sampling signal to the interpolation circuit.

7 Claims, 17 Drawing Sheets

PHYSICAL QUANTITY DETECTING DEVICE USING INTERPOLATION TO PROVIDE HIGHLY PRECISE AND ACCURATE MEASUREMENTS

CROSS REFERENCE TO RELATED APPLICATION

This application is based upon and claims the benefit of priority of the Japanese Patent Application No. 6-28358 filed on Feb. 25, 1994.

BACKGROUND OF THE INVENTION

1. Field of the Invention

The present invention relates to a physical quantity detecting device for detecting predetermined physical quantities and for generating digital data in accordance with the physical quantities.

2. Related Art

Physical quantity detecting devices for detecting physical quantities such as the rotational position and rotational speed of an object of interest as those disclosed in Japanese unexamined patent publication No. H3-125514 and No. H3-220814 have been known. They are configured to detect a transition of a physical quantity of an object of interest such in a manner wherein two pulse signals the phase difference between which changes with a change in the physical quantity are generated using a pair of pulse signal generators each comprising a detection element whose characteristics change with a change in the physical quantity, an oscillator as a physical quantity-to-time base conversion circuit for a pulse signal at a frequency corresponding to the characteristics of the detection element, and a frequency divider as a time base amplifier circuit for amplifying the pulse output by the oscillator by dividing the frequency thereof; the phase difference between the two pulse signals thus generated is converted into digital data using a pulse phase difference encoding circuit as a time A-D converter; and an increase or decrease in this digital data is detected.

This type of physical quantity detecting device digitally processes a physical quantity to be detected by converting it into a phase difference between pulse signals. Therefore, the use of a magnetic resistance element as a rotation sensor makes it possible to detect a very small change in rotation which cannot be detected by conventional analog sensors such as magnetic pick-up sensors. Further, such a rotation sensor will exhibit high endurance against environmental conditions because the signal processing circuit is constituted by a digital circuit.

In order to improve the accuracy in detecting a physical quantity with this type of physical quantity detecting device, the sampling cycle (i.e., operating cycle) of the pulse phase difference encoding circuit for converting the phase difference between the pulse signals frequency-divided by the frequency divider into digital data must be short to perform sampling at short intervals and the degree of signal amplification (i.e., division ratio) at the frequency divider for amplifying the oscillation signal from the oscillator by frequency-dividing the same must be high.

However, in order to make the sampling cycle of the pulse phase difference encoding circuit short, the degree of signal amplification of the frequency divider must be low. Conversely, in order to raise the degree of signal amplification at the frequency divider, the sampling cycle of the pulse phase difference encoding circuit must be shortened.

In consequence, the detecting accuracy of such a physical quantity detecting device cannot be improved by simply increasing or decreasing the sampling cycle of the pulse phase difference encoding circuit and the degree of signal amplification at the frequency divider.

SUMMARY OF THE INVENTION

It is therefore an object of the present invention to provide a physical quantity detecting device in which detecting accuracy can be improved without shortening the sampling cycle of the pulse phase difference encoding circuit and reducing the degree of signal amplification at the frequency divider.

A physical quantity detecting according to the present invention includes: a detection element whose characteristics change depending on the physical quantity to be detected; a physical quantity-to-time base conversion circuit for generating a detection signal in a cycle in accordance with the characteristics of the detection element; a time base amplifier circuit for multiplying the cycle of the detection signal from the physical quantity-to-time base conversion circuit by a predetermined value and for generating a pulse signal in the cycle obtained by the predetermined multiplication; a time A-D conversion circuit for converting the cycle of the pulse signal output by the time base amplifier circuit into digital data and for outputting the converted digital data; and an interpolation circuit to which a sampling signal and the digital data output by the time A-D conversion circuit are input for interpolating the digital data in a sampling cycle in accordance with the sampling signal and for sequentially outputting interpolated data, the interpolated data output by the interpolation circuit being output as the detection output signal representing the physical quantity.

The operation of a physical quantity detecting device according to the present invention will now be briefly described. The result of detection obtained by the detection element is converted into a detection signal having a cycle in accordance with the characteristics of the detection element (i.e., a physical quantity to be detected) and a pulse signal is generated at timing obtained by multiplying the cycle of the detection signal by a predetermined value. The pulse signal is converted into digital data corresponding to the cycle of the pulse signal, and the result of the conversion is output as detection data representing the physical quantity. The detection data is sampled in a sampling cycle based on the sampling signal to be interpolated.

Specifically, according to the present invention, the detection element and the physical quantity-to-time base conversion circuit generate a detection signal whose cycle changes depending on the physical quantity to be detected; the time base amplifier circuit generates a pulse signal by multiplying the cycle of the detection signal by a predetermined value; and the time A-D conversion circuit converts the cycle of the pulse signal into digital data. This allows a physical quantity to be detected by a fully digital processing circuit. Further, the accuracy of the detection of a physical quantity is improved by multiplying the cycle of the detection signal by a predetermined value.

As described earlier, in order to improve detecting accuracy, the cycle of the detection signal generated by the physical quantity-to-time base conversion circuit must be shortened to enhance the time resolution of the time A-D conversion circuit. Such a solution cannot be implemented using components of conventional devices as they are and the effectiveness of such a solution is limited. Taking such a situation into consideration, according to the present invention, detection data output by the time A-D conversion circuit is interpolated using an interpolation circuit.

In other words, with a physical quantity detecting device according to the present invention, accuracy in detecting a physical quantity can be improved without changing the characteristics of the physical quantity-to-time base conversion means and time A-D conversion means.

The detection signal generated by the physical quantity-to-time base conversion circuit is used as the sampling signal used in the interpolation circuit to sample the detection data. This simplifies the implementation because there is no need for providing a separate oscillation device to generate a sampling signal.

When a separate oscillation device for generating a sampling signal for interpolation is provided, since the cycle of the sampling of the detection data in the time A-D conversion circuit varies depending on the cycle of the pulse signal output by the time base amplifier circuit, i.e., the physical quantity to be detected, the oscillation frequency of the oscillation device must be controlled to a frequency which is a multiple of the output frequency of the detection data. For this purpose, a controller for controlling the oscillation frequency is required beside the oscillation device for generating the sampling signal, which makes the configuration of a device more complicated.

However, the output frequency of the detection signal of the physical quantity-to-time base conversion circuit is a signal obtained by multiplying the sampling frequency of the time A-D conversion circuit. Therefore, by using this detection signal as the sampling signal for the interpolation circuit as it is, the detection data can be accurately interpolated with a simple configuration without using an oscillation device and a controller for the same.

In addition to the above-described configuration, it is possible to provide a determination circuit for determining the transitions between increases and decreases in detection data sequentially output by the interpolation circuit and for outputting the result of the determination as a signal representing changes in the physical quantity and a clock signal generation circuit for dividing the cycle of the output signal from the determination circuit by a predetermined value to generate a clock signal shorter than at least the sampling cycle of the time A-D conversion circuit and for outputting the generated clock signal as the sampling signal for the interpolation circuit.

Specifically, in addition to generating a detection signal whose cycle varies depending on a physical quantity and generating digital data corresponding to the physical data from the cycle of the detection signal (more specifically, the cycle of a pulse signal) as described above, increases and decreases in the digital data are determined by the determination circuit. Further, in interpolating the detection data output by the time A-D conversion circuit by the interpolation circuit, the clock signal generation circuit generates a clock signal which is a multiple of the output signal of the determination circuit to be used as a sampling signal.

Thus, the interpolation circuit shortens the cycle of the determination of the increases and decreases in digital data performed by the interpolation circuit. This makes it possible to accurately detect changes in a physical quantity without changing the characteristics of the physical quantity-to-time base conversion circuit and time A-D conversion circuit.

The operation cycles of the interpolation circuit and determination circuit are determined by the clock signal generated by the clock signal generation circuit. Since this clock signal is a multiple of the frequency of the output signal of the determination circuit, the interpolation circuit and determination circuit always operate predetermined numbers of times per one period of a change in a physical quantity. This makes it possible to determine the change in the physical quantity with constant accuracy in accordance with the cycle.

In other words, even if the period of the change in the physical quantity becomes short, it is possible to perform the determination of the digital data the same number of times as in the case of the longer period. It is therefore possible to always determine changes in the physical quantity and to prevent reduction in the accuracy of the detection even when the period of a change in the physical quantity is short.

Further, a determination circuit for determining increases and decreases in the detection data sequentially output by the time A-D conversion circuit and for outputting a signal in accordance with the result of the determination may be provided, and the output signal of this determination circuit may be interpolated by an interpolation circuit to be output as a signal representing changes in the physical quantity.

Specifically, the detection signal output by the time A-D conversion circuit is not interpolated by the interpolation circuit but is directly input to the determination circuit to determine increases and decreases in the detection data obtained by the time A-D conversion circuit as they are. Then, interpolation is performed using a signal in accordance with the result of the determination, and a signal representing the increases and decreases in the physical quantity is output to the outside as interpolated data.

Thus, accuracy in detecting changes in a physical quantity can (especially, periodic changes in a physical quantity) be improved without changing the characteristics of the physical quantity-to-time base conversion circuit and time A-D conversion circuit.

For example, when the rotational speed and rotational position of a rotating body is detected as such a physical quantity, projections may be provided on the rotational axis of the rotating body at predetermined rotational angles and a detection element may be disposed in a position where those projections pass through as the rotational axis rotates to detect the movement of the projections toward and away from the detection element. This makes it possible to know the rotational speed and rotational position of the rotating body from the output signal of the determination circuit. In this case, since the frequency of the output circuit of the determination circuit is determined by the rotational speed of the rotating body and the number of the projections provided on the rotational axis, the number of the projections provided on the rotational axis must be increased to improve the detecting accuracy of the rotational speed and rotational position. However, there is a physical limitation on the increase in the number of the projections.

However, for example, accuracy in detecting the rotational speed and rotational position can be improved in the case wherein the determination circuit outputs a signal changing each time the rotating body makes a rotation of 30 deg, by multiplying the frequency of the output signal to generate a clock signal changing each time the rotating body makes a rotation of an angle which is obtained by dividing 30 deg. by the multiplier (3 deg. if the multiplier is 10) and by outputting the clock signal as a signal representing the state of the rotation of the rotating body.

In addition, it is possible to generate a reference pulse whose phase is to be compared with that of the pulse signal output by the time base amplifier circuit, and the phase difference between the pulse signal and the reference signal may be converted into digital data by the time A-D converter.

That is, instead of converting the cycle of the pulse signal output by the time base amplifier circuit into digital data as it is, a reference pulse is generated to be phase-compared with the pulse signal and the phase difference between the pulse signal and the reference pulse is converted into digital data to detect deviation of the detected physical quantity from a reference value.

If the characteristics of the reference pulse generation circuit and the physical quantity-to-time base conversion circuit are chosen to be the same against conditions under which they are used, e.g., if a reference pulse generation circuit having the same temperature characteristics as those of the physical quantity-to-time base conversion circuit is used, the detection of a physical quantity will be free from the influence of changes in the environment wherein they are used such as temperature that causes changes in the cycle of the pulse signal output by the physical quantity-time base conversion circuit. This makes it possible to improve accuracy in detecting a physical quantity.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Preferred embodiments of the present invention will now be described with the accompanying drawings.

Figure 1:
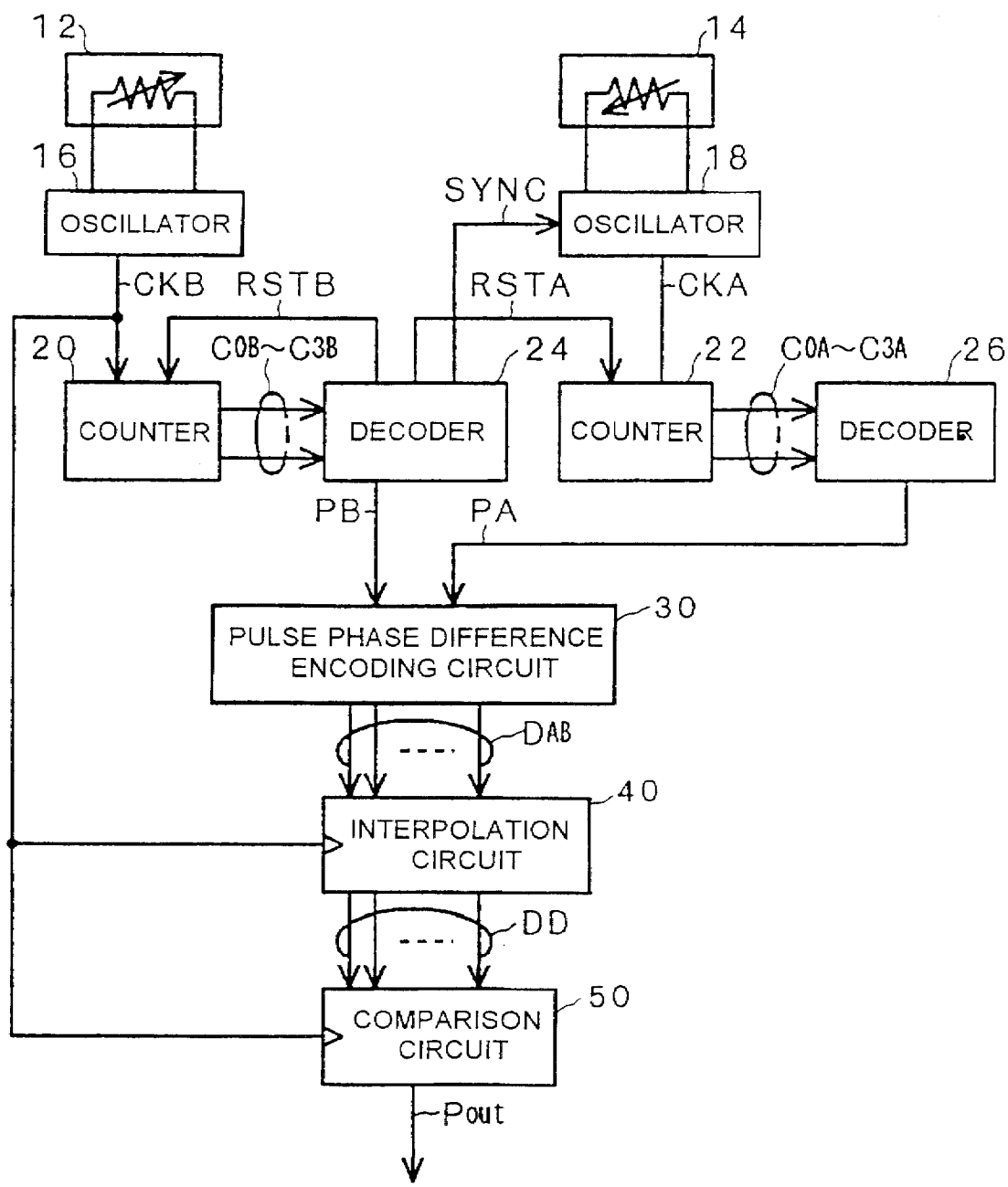
FIG. 1 is a block diagram showing an overall configuration of a physical quantity detecting device according to a first embodiment of the present invention.

FIG. 1 is a block diagram showing a configuration of a physical quantity detecting device according to a first embodiment of the present invention.

The physical quantity detecting device according to the present embodiment is aimed at detecting a change in magnetism as a physical quantity. As shown in FIG. 1, it is equipped with a pair of magnetic resistance elements 12 and 14 whose resistance varies depending of the strength of magnetism acting thereon as detection elements. These magnetic resistance elements 12 and 14 are identical to each other in shape and are disposed in positions 90 deg offset from each other so that their values of resistance will change in opposite directions in response to the same change in magnetism. These magnetic resistance elements 12 and 14 are connected to a pair of oscillators 16 and 18, respectively, whose oscillation frequencies change in response to changes in the resistance of the magnetic resistance elements 12 and 14, respectively.

Figure 2:
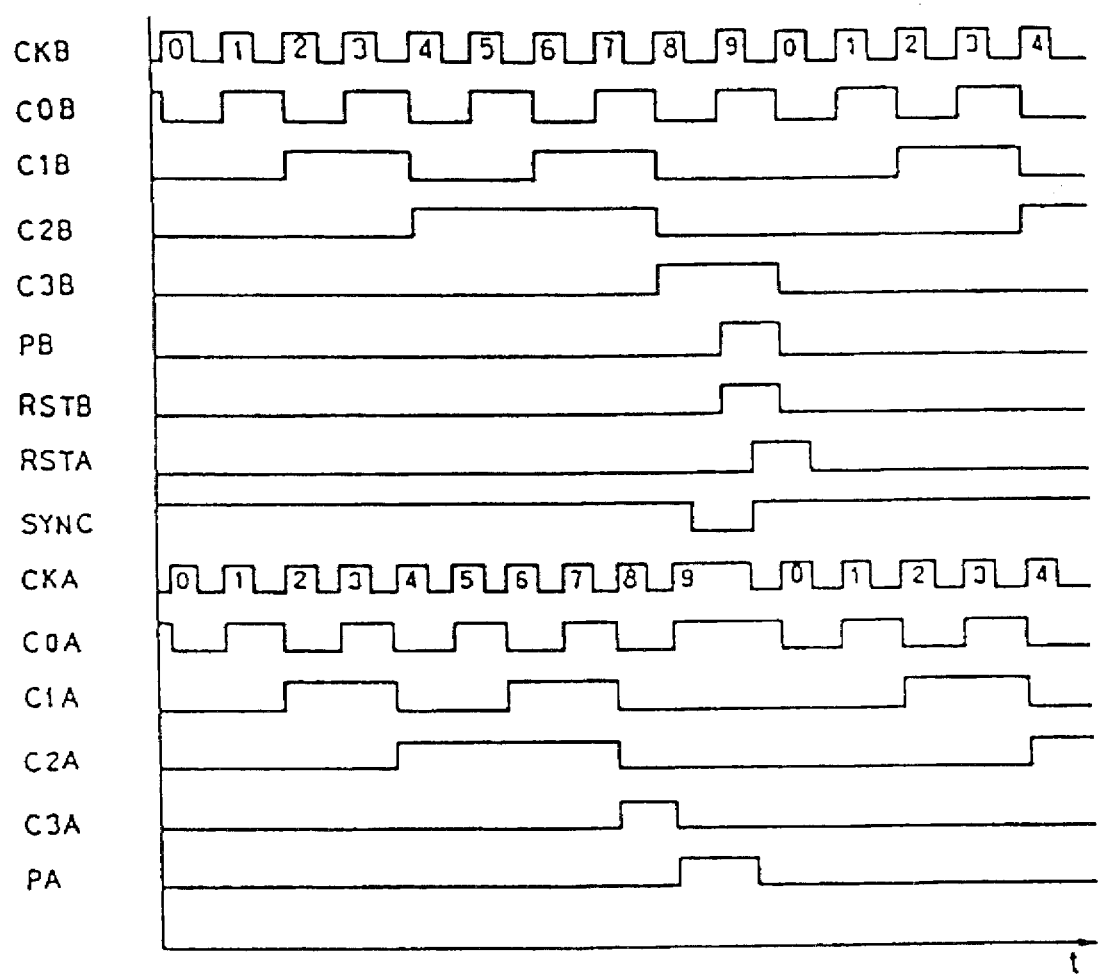
FIG. 2 is a time chart illustrating the operation of a counter and decoder for generating pulse signals PA and PB.

The oscillators 16 and 18 incorporate a waveform shaping circuit to generate pulse signals CKB and CKA (see to FIG. 2) in cycles in accordance with the values of resistance of the magnetic resistance elements 12 and 14 and output the pulse signals CKB and CKA to counters 20 and 22, respectively. These oscillators 16 and 18 correspond to the above-described physical quantity-to-time base conversion circuit.

The counters 20 and 22 count the number of the pulses of the pulse signals CKA and CKB from the respective oscillators 18 and 16 and output 4-bit count data COB through C3B and C0A through C3A (see FIG. 2) representing the values counted to decoders 24 and 26, respectively. The decoders 24 and 26 determine from the count data COB through C3B and C0a through C3A output by the counters 20 and 22 whether the count values in the counters 20 and 22 have reached a predetermined value (9 in the present embodiment) and output pulse signals PB and PA (see FIG. 2) when the predetermined value has been reached.

The decoder 24 not only outputs the pulse signal PB but also outputs reset signals RSTB and RSTA to the counters 20 and 22, respectively, when the count value in the counter 20 has reached the predetermined value to reset the counters 20 and 22. It further outputs a synchronization signal SYNC to the oscillator 18 to cause the counters 20 and 22 to start the next counting operation in synchronization.

That is, in the present embodiment, the number of the pulses of pulse signals CKB and CKA output by oscillators 16 and 18 are counted by counters 20 and 22 and pulse signals PB and PA are output by decoders 24 and 26 when the count values have reached a predetermined value (9). This results in the generation of two pulse signals PB and PA the phase difference between which is equal to a value obtained by multiplying the phase difference between the pulse signals CKB and CKA by the predetermined value (9).

In the present embodiment, the counter 20 and decoder 24 for generating the pulse signal PB at timing which is obtained by multiplying the cycle of the pulse signal CKB output by the oscillator 16 by the predetermined value correspond to a time base amplifier circuit while the counter 22 and decoder 26 for generating the pulse signal PA at timing which is obtained by multiplying the cycle of the pulse signal CKA output by the oscillator 18 by the predetermined value correspond to a reference pulse generation circuit.

The pulse signals PB and PA output by the decoders 24 and 26 are input to a pulse phase difference encoding circuit 30 as a time A-D conversion circuit.

Figure 3:
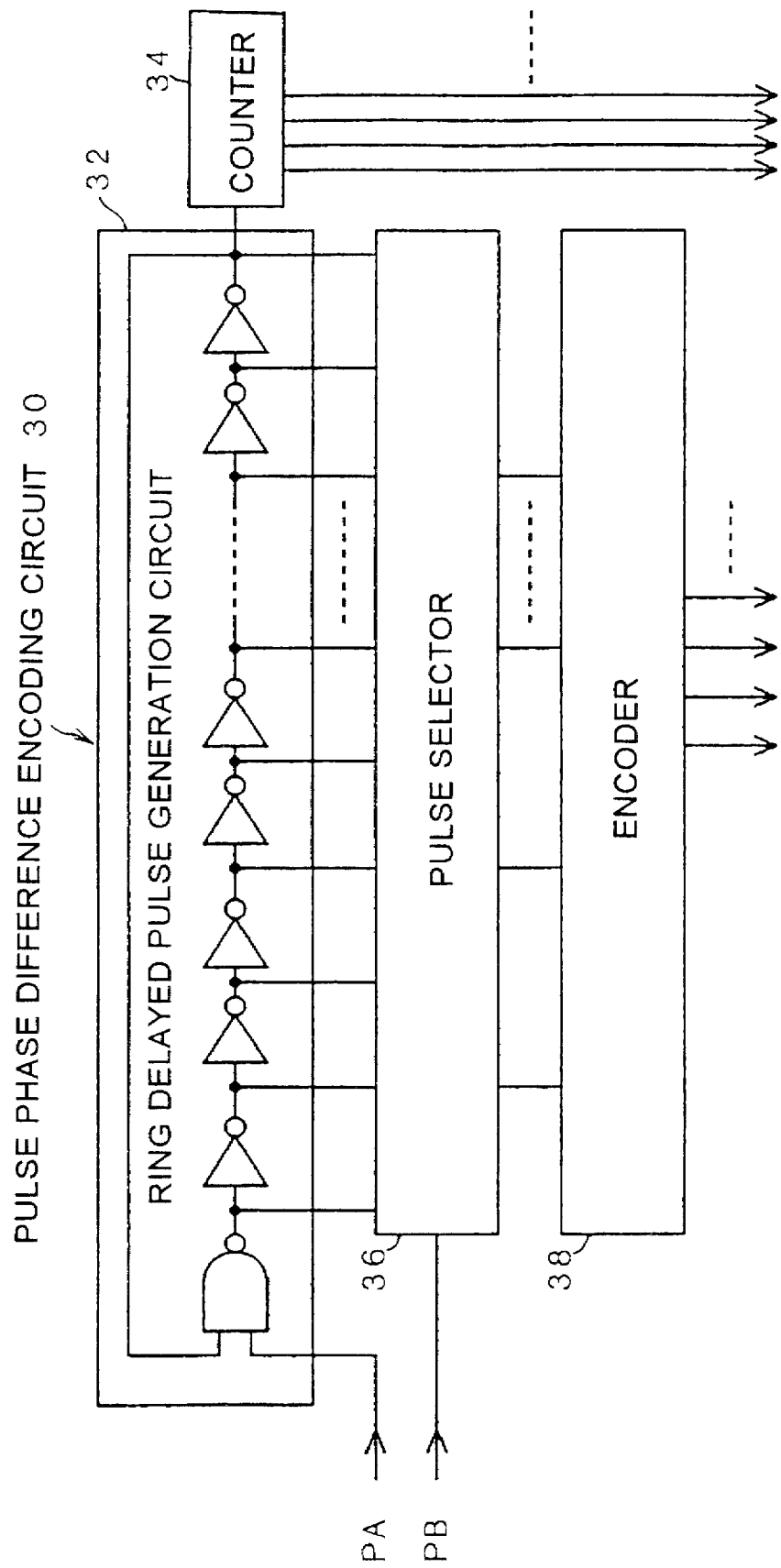
FIG. 3 is a block diagram showing a configuration of a pulse phase difference encoding circuit for generating digital data DAB.

As shown in FIG. 3, the pulse phase difference encoding circuit 30 is constituted by a ring delayed pulse generation circuit 32 consisting of a NAND circuit and an even number of inversion circuits (inverters) connected in the form of a ring, a counter 34, a pulse selector 36, and an encoder 38. The pulse signal PA is sent to one of the inputs of the NAND circuit forming a part of the ring delayed pulse generation circuit 32 while the pulse signal PB is input to the pulse selector 36.

This pulse phase difference encoding circuit 30 is substantially the same as that disclosed in Japanese unexamined patent publication No. H3-220814 and operates as described below.

First, since the pulse signal PA is input to the NAND circuit of the ring delayed pulse generation circuit 32, the output of the NAND circuit is locked to a high level if the pulse signal PA is at a low level. When the pulse signal PA becomes the high level, the output of the NAND circuit is inverted from the high level to the low level. Thereafter, the outputs of the inverters connected to the output of the NAND circuit are sequentially inverted. Since the inverters form an even number of stages, the output of the inverter at the final stage becomes the low level to input a signal at the low level to the NAND circuit. As a result, the output of the NAND circuit is inverted from the low level to the high level to cause the outputs of the inverters connected to the output of the NAND circuit to be sequentially inverted again.

That is, in the ring delayed pulse generation circuit 32, when the pulse signal PA is not at the high level, the outputs of the inverters are locked (reset) to a predetermined level and, when the pulse signal PA becomes the high level, the pulse signal PA is circulated with delay time produced by the circuits forming the ring involved.

Further, the ring delayed pulse generation circuit 32 outputs a plurality of delayed pulses from middle of its path to the pulse selector 36, the delay time of each delayed pulse being determined by the number of the inverter stages including the NAND circuit it has passed through. Each time the pulse signal PB is input, the pulse selector 36 selects the delayed pulse from the stage which has been reached by the pulse signal PA at that time and outputs a signal corresponding to the selected delayed pulse to the encoder 38. The encoder 38 outputs a binary digital signal corresponding to this input.

The number of circulations the pulse signal PA makes in the ring delayed pulse generation circuit 32 is count by the counter 34 which in turn outputs the result as high order bits of the output of the encoder 38. The counting operation of this counter 34 is triggered by rising and falling edges of an input signal.

Figure 6:
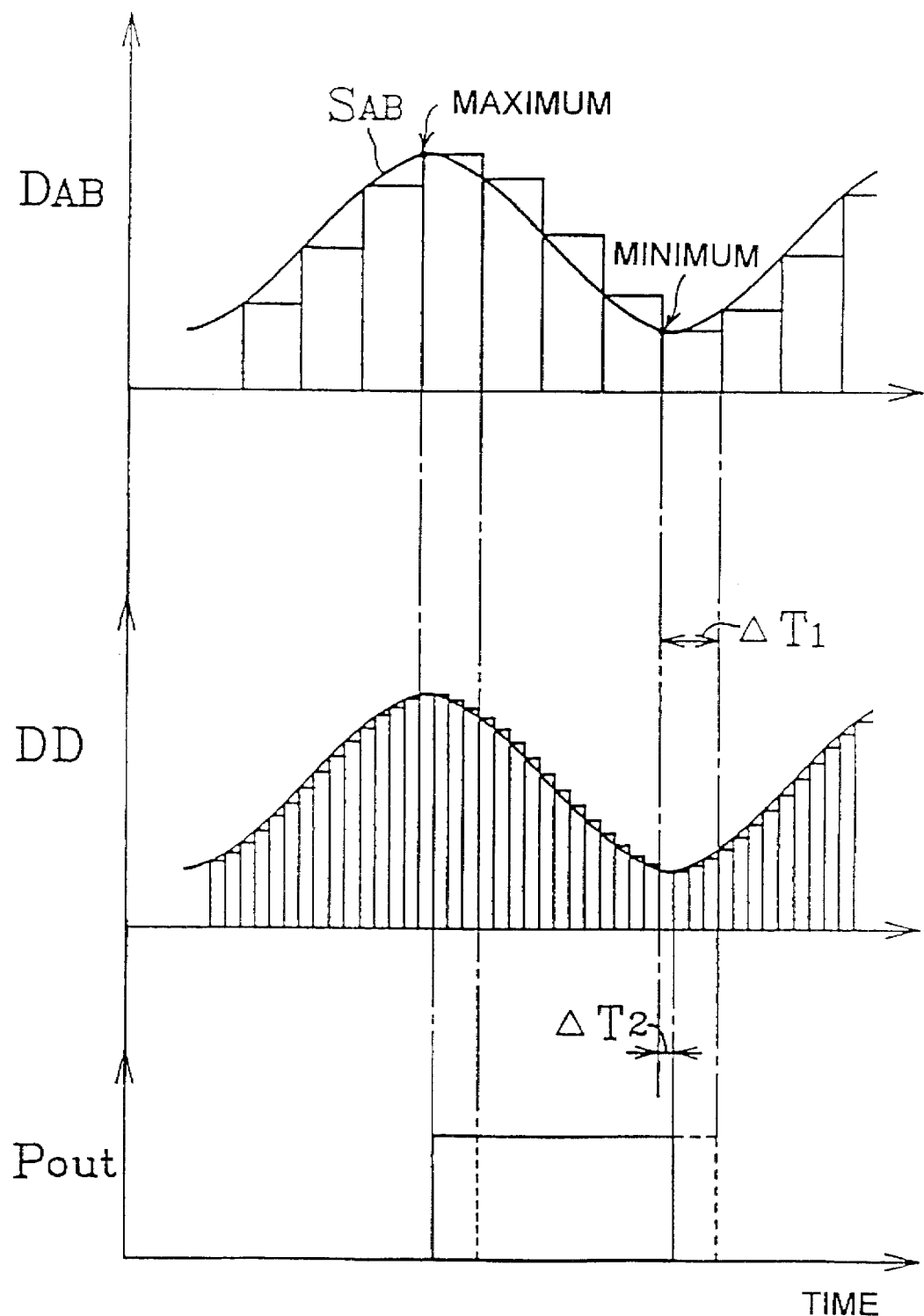
FIG. 6 is a time chart illustrating the operation of the physical quantity detecting device according to the first embodiment.

Thus, the pulse phase difference encoding circuit 30 outputs digital data DAB in accordance with the time interval between the rise of a pulse signal PA and the rise of a pulse signal PB, i.e., the phase difference between the pulse signals PA and PB (see FIG. 6).

The digital data DAB output by the pulse phase difference encoding circuit 32 are input to an interpolation circuit 40.

Figure 4:
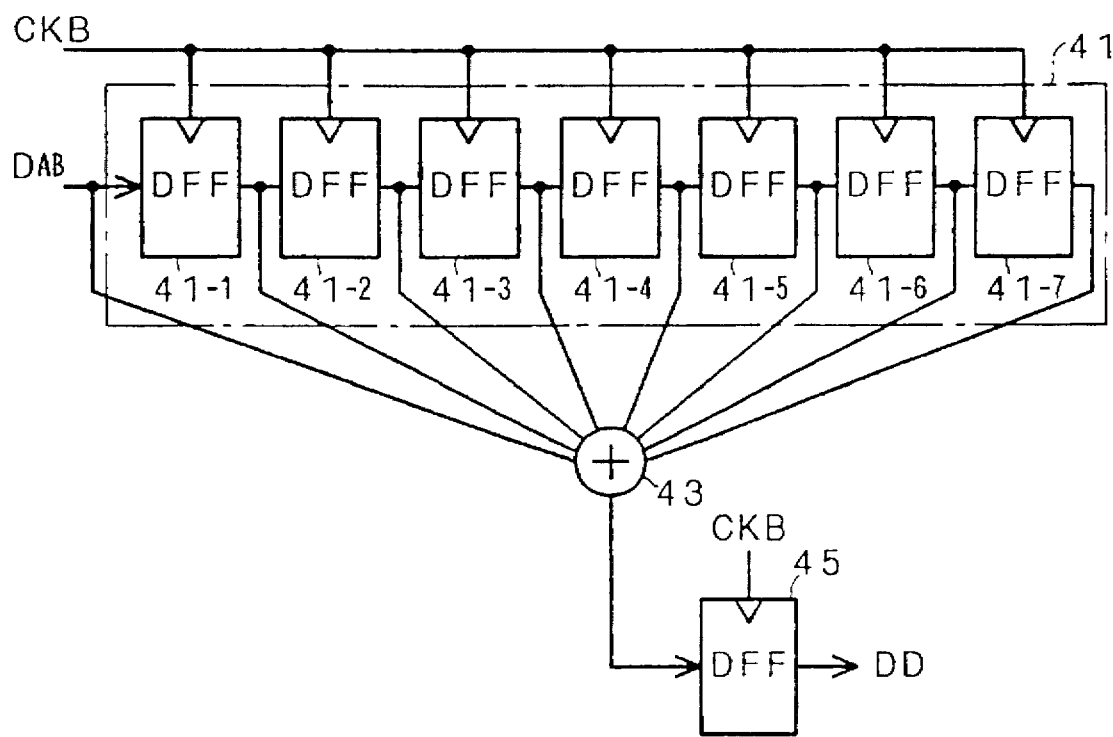
FIG. 4 is a block diagram showing a configuration of an interpolation circuit for interpolating the digital data DAB.

As shown in FIG. 4, the interpolation circuit 40 is constituted by a digital delay line 41 having a configuration in which seven D-flip-flops (hereinafter referred to as DFF) 41-1 through 41-7 capable of latching all bits of the digital data DAB are connected in series to sequentially latch the digital data DAB in the DFF 41-1 at the first stage through the DFF 41-7 at the final stage according to external clock signals, an adder 43 for adding the latest digital data DAB output by the pulse phase difference encoding circuit 30 and all of the seven pieces of digital data latched in the DFFs 41-1 through 41-7 forming the delay line 41, and a DFF 45 for latching data output by the adder 43 and for outputting it as interpolated data DD. The pulse signal CKB from the oscillator 16 is input to each of the DFFs 41-1 through 41-7 and DFF 45 as a clock signal.

That is, in the interpolation circuit 40, the digital data DAB from the pulse phase difference encoding circuit 30 are repeatedly fetched using the pulse signal CKB from the oscillator 16 as a sampling signal, and the data fetched by the recent 8 times of sampling are added together to generate digital data DD corresponding to the average of the sampled data which are output as interpolation data.

Figure 5:
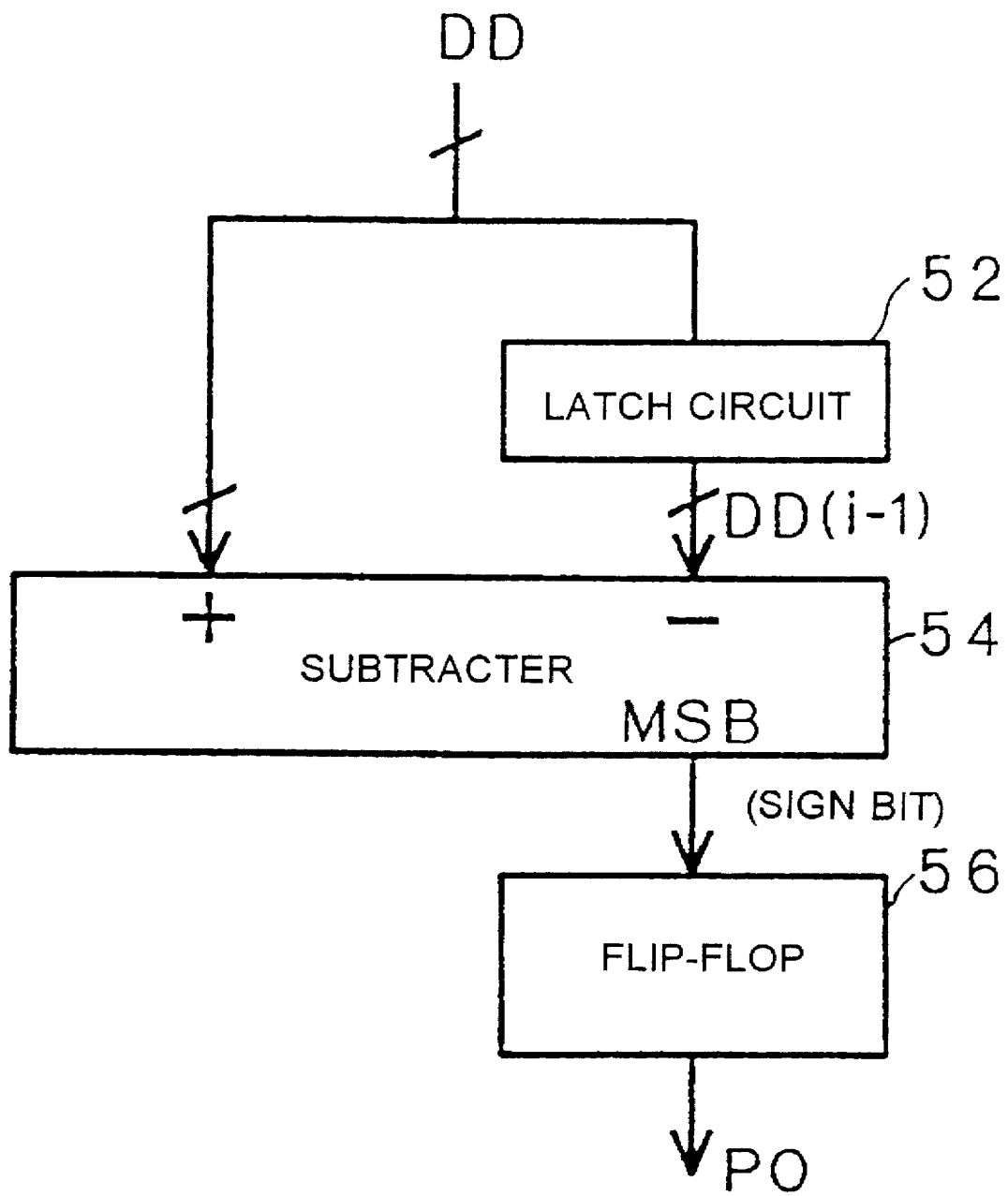
FIG. 5 is a block diagram showing a configuration of a comparison circuit for determining changes in magnetism.

The digital data DD output by the interpolation circuit 40 are input to a comparison circuit 50. As shown in FIG. 5, the comparison circuit 50 is constituted by a latch circuit 52 for latching the digital data DD input from the interpolation circuit 40, a subtracter 54 for calculating the difference between the previous digital value DD(i-1) latched by this latch circuit 52 and the latest digital data DD input by the interpolation circuit 40, and a flip-flop circuit 56 for outputting a sign bit signal indicating whether the result of the calculation at the subtracter 54 is positive or negative as a determination signal Pout indicating a change in magnetism.

In other words, this comparison circuit 50 generates a signal whose level is inverted when the digital data DD generated by the interpolation circuit 40 begin to decrease or increase and outputs it to the outside as the determination signal Pout. With the physical quantity detecting device according to the present embodiment, it is therefore possible to detect a change in magnetism from this determination signal Pout.

The pulse signal CKB from the oscillator 16 is input to each of the circuits that constitute the comparison circuit 50 as a sampling signal to cause it operate in synchronization with the interpolation circuit 40.

As described above, in the physical quantity detecting device according to the present embodiment, the oscillators 16 and 18 output the pulse signals CKB and CKA in cycles which change with changes in magnetism; the counters 20 and 22 and the decoders 24 and 26 generate the two pulse signals PB and PA the phase difference between which is equal to a value obtained by multiplying the difference between the periods of the pulse signals CKB and CKA by a predetermined value (9); the pulse phase difference encoding circuit 30 converts the phase difference between the pulse signals PB and PA into the digital data DAB; and the digital data DAB are interpolated using the interpolation circuit 40 which operates in accordance with the pulse signal CKB serving as a sampling signal.

Therefore, even if the sampling cycle of the pulse phase difference encoding circuit 30 is relatively long and, as a result, the digital data DAB obtained at the pulse phase difference encoding circuit 30 cannot follow up a change in the strength of magnetism SAB to which the magnetic resistance elements 12 and 14 have been actually subjected as shown in FIG. 6, the interpolation circuit 40 makes it possible to generate digital data DD which change substantially in accordance with the strength of magnetism SAB. It is therefore possible to improve accuracy in detecting the strength of magnetism.

In addition, according to the present embodiment, the comparison circuit 50 determines an increase or decrease in the strength of magnetism SAB based on the digital data DD generated by the interpolation circuit and outputs the determination signal Pout indicating the increase or decrease in the strength of magnetism SAB. Since the digital data DD change substantially in accordance with the strength of magnetism SAB, it is possible to prevent the timing of an inversion of the determination signal Pout from greatly deviating from the maximum or minimum value of the strength of magnetism SAB.

Specifically, as shown in FIG. 6, since the deviation of a rising or falling edge of the determination signal Pout from the maximum or minimum value of the strength of magnetism SAB changes depending on the cycle of the sampling of the digital data input to the comparison circuit 50, a deviation ΔT1 obtained by determining an increase or decrease in the strength of magnetism SAB using the digital data DAB output by the pulse phase difference encoding circuit 30 becomes large. In the present embodiment, however, the digital data DAB are interpolated by the interpolation circuit 40 to generate the digital data DD and the determination of increases and decreases in the strength of magnetism SAB is made based on this data DD. This makes it possible to provide a reduced deviation ΔT2 of a rising or falling edge of the determination signal Pout from the maximum or minimum value of the strength of magnetism SAB.

It is therefore possible to improve the accuracy of control over an object of interest when the control is performed by detecting the timing of an increase or decrease in the strength of magnetism SAB from this determination signal Pout.

In addition, since the interpolation circuit 40 operates on the pulse signal CKB from the oscillator 16 serving as a sampling signal, there is no need for providing a special oscillation device for generating a sampling signal for interpolation. This makes it possible to simplify the configuration of the circuit for interpolating the digital data DAB.

In FIG. 6, the interpolated digital data DD are shown to change four times in a sampling period of the digital data DAB. In the present embodiment, however, the counter 20 and decoder 24 count nine pulse signals CKB and reset each part of the device upon the next pulse signal to initiate the next counting operation. Therefore, the frequency of the sampling on the digital data DAB in the pulse phase difference encoding circuit 30 is one-tenth the output frequency of the pulse signal CKB from the oscillator 16. Accordingly, the digital data DD actually change ten times in a sampling period of the digital data DAB.

Further, although FIG. 6 shows that the digital data DAB are generated in a constant cycle, the cycle of the sampling of the digital data DAB changes depending on the output cycle of the pulse signal CKB from the oscillator 16, i.e., the resistance of the magnetic resistance element 12 which changes with the strength of magnetism SAB. Therefore, the cycle in which digital data DAB are generated is not constant cycle in practice but becomes shorter as the strength of magnetism SAB increases.

FIG. 6 is provided as a simplified illustration of the operation the physical quantity detecting device according to the present embodiment, and the changes in the digital data DAB and DD shown are different from those actually occur.

According to the above-described embodiment, since the pulse signal CKB from the oscillator 16 is used as a sampling signal input to the interpolation circuit 40, the digital data DAB can be interpolated at a sampling frequency which is ten times the sampling frequency of the pulse phase difference encoding circuit and the digital data DD obtained as a result of this interpolation exactly reflect the strength of magnetism SAB to which the magnetic resistance elements 12 and 14 are actually subjected. When an increase or decrease in the strength of magnetism SAB is further determined from the interpolated digital data DD and the result of the determination as the determination signal Pout as in the above embodiment, the accuracy of the determination can be improved by making the sampling cycle of the interpolation circuit 40 equivalent to the cycle of the determination signal Pout, i.e., the cycle of changes in the strength of magnetism SAB.

A physical quantity detecting device will be now described as a second embodiment of the present invention, in which the accuracy of the comparison circuit 50 which determines increases and decreases in the strength of magnetism SAB is improved by making the sampling cycle of the interpolation circuit 40 equivalent to the cycle of the determination signal Pout.

Figure 7:
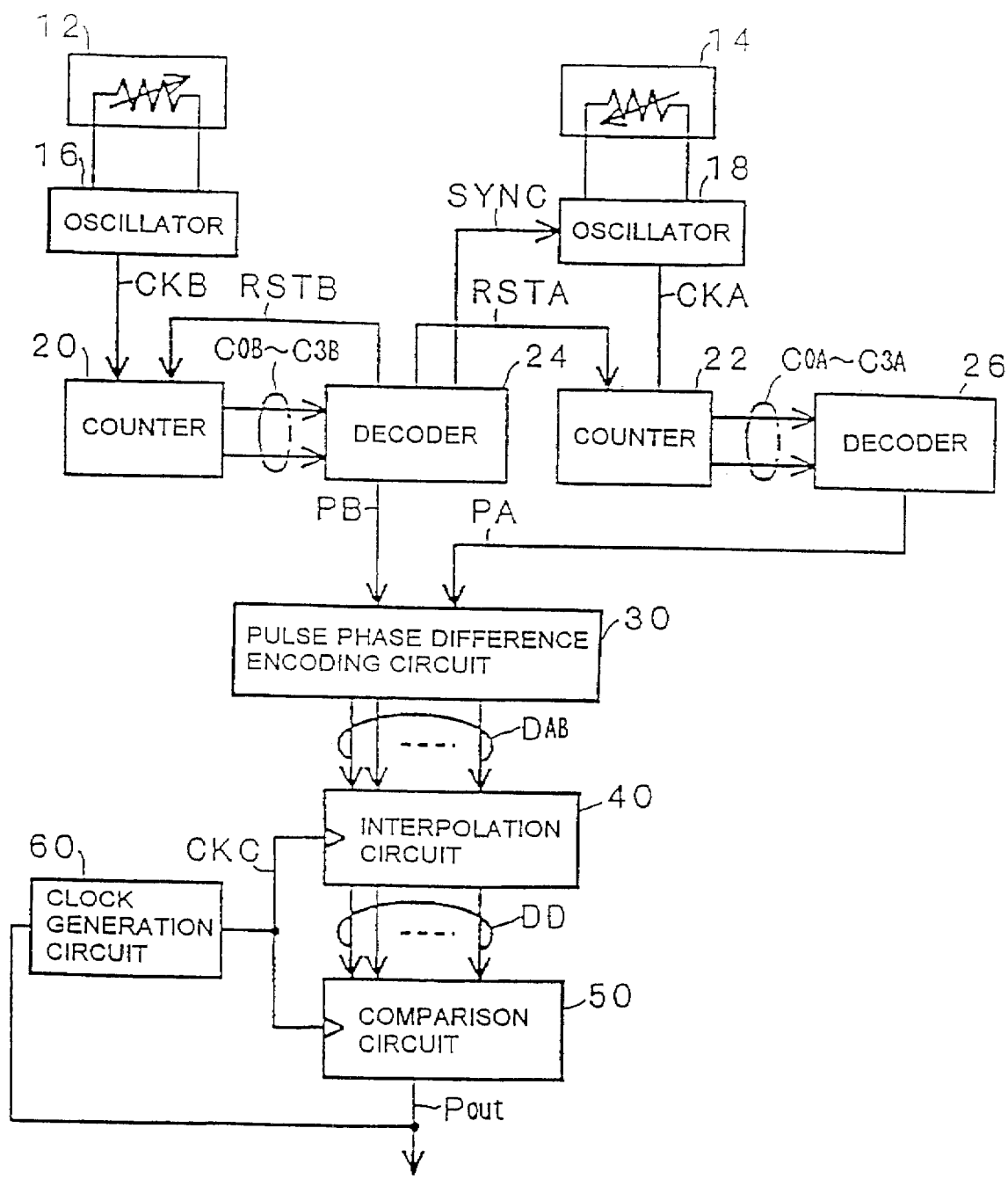
FIG. 7 is a block diagram showing an overall configuration of a physical quantity detecting device according to a second embodiment of the present invention.

FIG. 7 is a block diagram showing a configuration of a physical quantity detecting device according to the second embodiment of the present invention.

As shown in FIG. 7, the physical quantity detecting device according to the present embodiment is substantially identical in configuration to the physical quantity detecting device according to the first embodiment shown in FIG. 1 except that the pulse signal CKB output by the oscillator 16 is not used as a sampling signal for the interpolation circuit 40 and comparison circuit 50 and that a clock generation circuit 60 is provided instead to generate a clock signal CKC which is a predetermined multiple (32 in the present embodiment) of the frequency of the determination signal Pout, the clock signal CKC being input to the interpolation circuit 40 and comparison circuit 50 as a sampling signal.

Therefore, the description of the configuration of the device according to the present embodiment will be limited to the clock generation circuit 60 and other parts will not be described and are shown in FIG. 7 under the same reference numbers as those in the first embodiment as shown in FIG. 1. The clock generation circuit 60 in the present embodiment multiplies the determination signal Pout by 32. This is to cause the interpolation circuit 40 to operate in a cycle shorter than the sampling cycle of the pulse phase difference encoding circuit 30.

Figure 8:
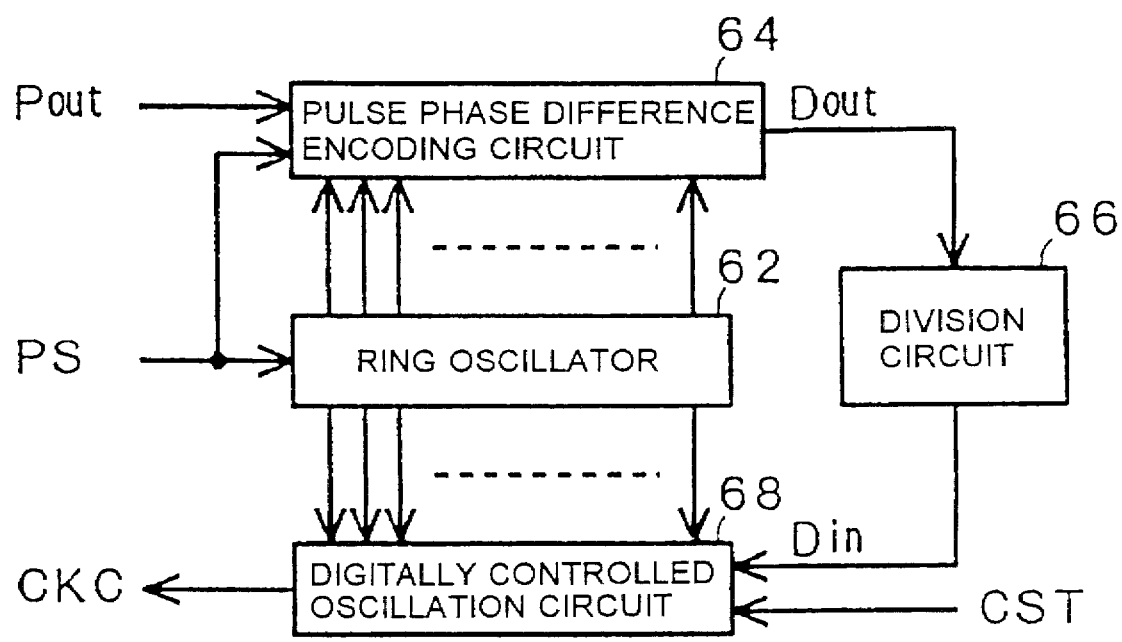
FIG. 8 is a block diagram showing a configuration of a clock generation circuit.

As shown in FIG. 8, the clock generation circuit 60 in the present embodiment comprises a ring oscillator 62 which is constituted by a multiplicity of inverting circuits connected in the form of a ring and which circulates a pulse signal by sequentially delaying it by means of the inverting operation of the inverting circuits when a control signal PS at a high level is being input from the outside, a pulse phase difference encoding circuit 64 which converts the phase difference between a rise and the next rise (i.e., the cycle) of the determination signal Pout into digital data Dour based on delayed signals sequentially output by predetermined inverting circuits forming a part of the ring oscillator 62, a division circuit 66 which divides the digital data Dout obtained by the pulse phase difference encoding circuit 64 by a predetermined value (32 in the present embodiment) to generate control data Din representing the output cycle of a clock signal CKC, and a digitally controlled oscillation circuit 68 which outputs the clock signal CKC which has been obtained by multiplying the determination signal Pout based on the control data Din output by the division circuit 66 and the delayed signals sequentially output by the ring oscillator 62.

Figure 9:
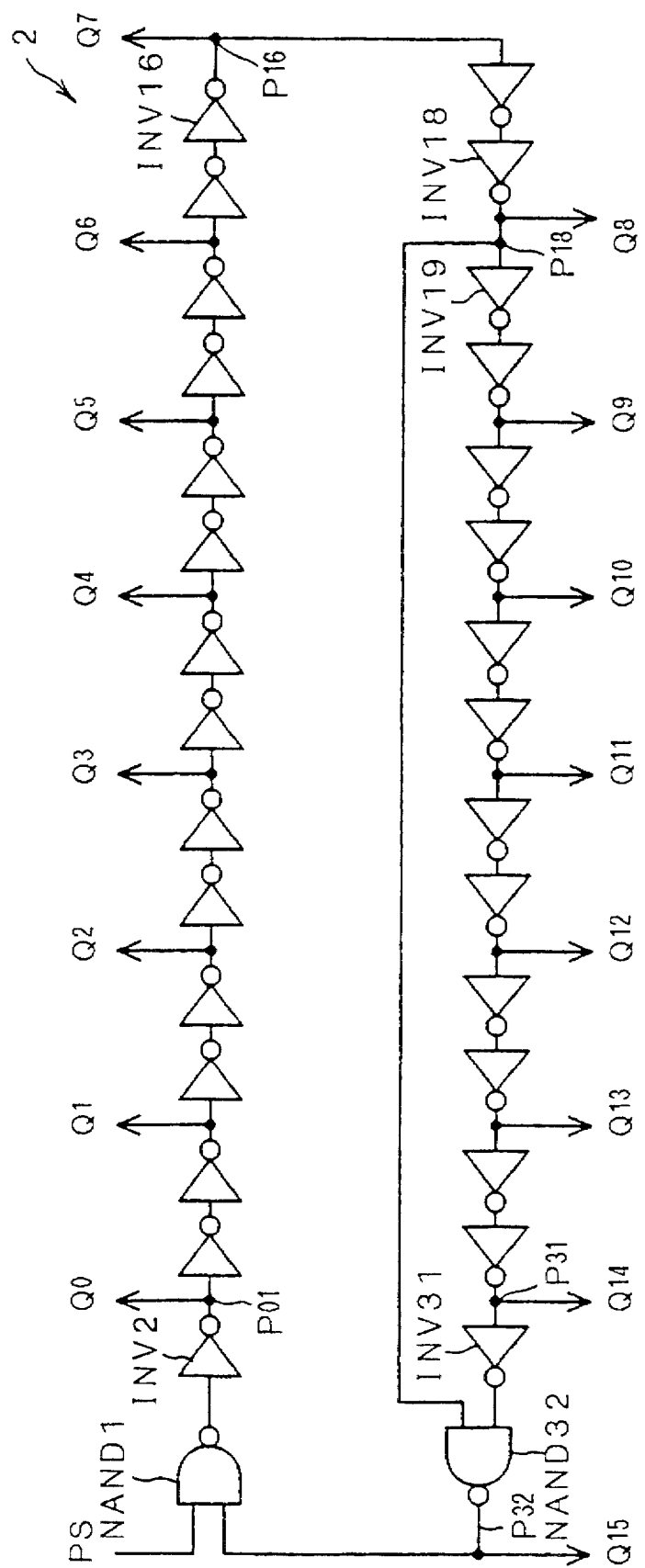
FIG. 9 illustrates a configuration of a ring oscillator in the clock generation circuit.

First, as shown in FIG. 9, the ring oscillator 62 includes two two-input NAND gates (hereinafter simply referred to as NAND gates) NAND1 and NAND32 and thirty inverters INV2 through INV31 as the inverting circuits. The output terminals of these circuits are sequentially connected to the input terminals of the respective succeeding stages to form a ring. An external control signal PS is input to the input terminal of the NAND gate NAND1 which is not connected to the NAND gate NAND32 (this input terminal is hereinafter referred to as an activation terminal) while the output signal of the inverter INV18 is input to the input terminal of the NAND gate NAND32 which is not connected to the inverter INV31 (this input terminal is hereinafter referred to as a control terminal). On the other hand, the output terminals of the inverting circuits connected at stages which are in even-numbered places when counted from the NAND gate NAND1 are provided with output terminals Q0 through Q15, respectively. Each of these output terminals Q0 through Q15 is connected to the pulse phase difference encoding circuit 64 and the digitally controlled oscillation circuit 68.

Figure 10:
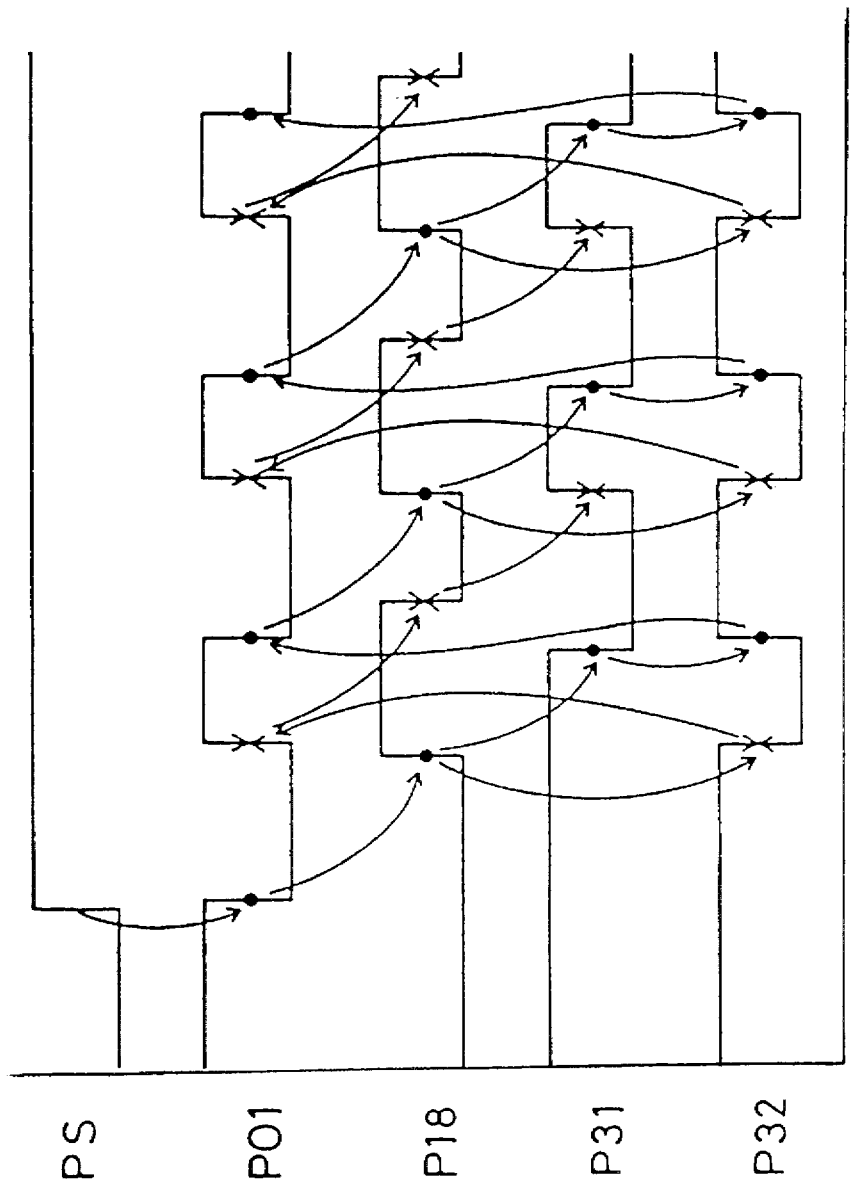
FIG. 10 is a time chart illustrating the operation of the ring oscillator.

The operation of the ring oscillator 62 having such a configuration will now be described with reference to FIG. 10.

When the control signal PS is at a low level, the output P01 of the NAND gate NAND1 becomes the high level. Then, the output of the inverters at stages in even-numbered places when counted from the NAND gate NND1 becomes the low level while the output of the inverters at stages in odd-numbered places becomes the high level. This results in a stable state. In this state, the output P18 of the inverter INV18 input to the control terminal of the NAND gate NAND32 is at the low level. Therefore, the NAND gate NAND32 exceptionally outputs the high level in spite of the fact that it is connected at an even-numbered stage. In other words, with such a configuration, the input and output signals of the NAND gate NAND1 are both at the high level, and the NAND gate NAND1 starts an inverting operation at the subsequent transition of the control signal PS from the low level to the high level.

When the subsequent transition of the control signal from the low level to the high level occurs, the output P01 of the NAND gate NAND1 changes from the high level to the low level. As a result, the output of the subsequent inverters is sequentially inverted. The output of the inverters at odd-numbered stages changes from the high level to the low level, and the output of the inverters at even-numbered stages changes from the low level to the high level. In the following description, an edge of a pulse signal which sequentially circulates on the ring oscillator 62 as falling outputs of the inverting circuits at odd-numbered stages and rising outputs of the inverting circuits at even-numbered stages when the control signal PS is at the high level is referred to as a main edge and indicated by the dots in FIG. 10.

When this main edge arrives at the inverter INV18 to cause an inversion of the output P18 of the inverter INV18 from the low level to the high level, since the output level of the inverter INV31 is still at the high level, both of two input signals at the NAND gate NAND32 become the high level. Thus, the NAND gate NAND32 starts an inverting operation, and the output thereof is inverted from the high level to the low level. In the following description, when the main edge is input to the NAND gate NAND32 through the control terminal thereof and is inverted by the NAND gate NAND32 to become an edge of a pulse signal which sequentially circulates on the ring oscillator 62 as rising outputs of the inverting circuits at odd-numbered stages and falling outputs of the inverting circuits at even-numbered stages, such an edge is referred to as a reset edge and is indicated by the x's in FIG. 10. This reset edge is circulated on the ring oscillator 62 along with the main edge generated by the NAND gate NAND1.

The main edge is sequentially inverted by the inverters subsequent to the inverter INV18 and is input to the NAND gate NAND32 as a result of the inversion of the output of the inverter INV31 from the high level to the low level. At this time, since the input signal at the control terminal of the NAND gate NAND32, i.e., the output signal of the inverter INV18, is at the high level, the sequential inversion of the main edge is continued at the NAND gate NAND32 and the subsequent inverters starting with NAND gate NAND1 to propagate the main edge on the ring oscillator 62.

The reason why the output signal of the inverter INV18 is still at the high level when the main edge has arrived at the NAND gate NAND32 via the inverters INV19 through INV31 as described above is the fact that the number of the inverters ranging from the INV19 to INV31 is 13 while the number of the inverters in the range from the NAND gate NAND32 to the inverter INV18 is 19 and, therefore, the main edge is input to the NAND gate NAND32 before the reset edge is propagated from the NAND gate NAND32 to the inverter INV18.

On the other hand, the reset edge generated by the NAND gate NAND32 arrives at the inverter INV18 again via inverters including the NAND gate NAND1 to invert the signal level at the control terminal of the NAND gate NAND32 from the high level to the low level. At this time, since the signal input from the inverter INV31 to the NAND gate NAND32 has been already changed to the low level by the main edge, the output of the NAND gate NAND32 will not change, and the reset edge is sequentially propagated to the NAND gate NAND32 via the normal route from the inverter INV18 and through the inverters INV19 through INV31.

When the reset edge arrives at the inverter INV31, the signal input from the inverter INV31 to the NAND gate NAND32 is inverted from the low level to the high level. At substantially the same time, the main edge arrives at the inverter INV18 to invert the signal input to the control terminal of the NAND gate NAND32 also from the low level to the high level. This is because those edges travel exactly the same number (i.e., 50) of inverting circuits before they arrive at the NAND gate NAND 32. Specifically, the main edge travels from the NAND gate NAND1 to make one cycle through the ring oscillator 62 via the normal route and arrives at the inverter INV18 after passing through the NAND gate NAND1 again while the reset edge is generated as a result of the activation of the inverting operation of the NAND gate NAND32 after the main edge arrives at the inverter INV18 from the NAND gate NAND1 and makes one cycle through the ring oscillator 62 via the normal route.

In the ring oscillator 62, the inversion response time of the inverters at even-numbered stages is preset so that the output of a fall is faster than the output of a rise and, conversely, the inversion response time of the inverters at odd-numbered stages is preset so that the output of a rise is faster than the output of a fall. As a result, the reset edge arrives at the NAND gate NAND32 slightly earlier than the main edge.

Therefore, when the reset edge inverts the output of the inverter INV31 from the low level to the high level, the signal input to the control terminal of the NAND gate NAND32 is still at the low level. So, the output of the NAND gate NAND32 is not inverted and, when the main edge arrives at the inverter IV18 with a slight delay to invert the signal input to the control terminal of the NAND gate NAND32 from the low level to the high level, the output of the NAND gate NAND32 is inverted from the high level to the low level. Thus, the reset edge temporarily disappears at this point and is regenerated by the main edge.

Thereafter, the above-described operation is repeated and the reset edge is regenerated each time the main edge makes one cycle and circulates through the ring oscillator 62 along with the main edge. When the control signal PS becomes the low level, such a series of operations is stopped and the above-described initial state is restored.

As described above, in the ring oscillator 62, two pulse edges (main and reset edges) which are generated at different timing are circulated in the same path of circulation. Therefore, the output of the NAND gate NAND1 is inverted by the reset edge before the main edge which has been generated by itself returns thereto while the output of the NAND gate NAND32 is inverted by the main edge before the reset edge which has been generated by itself returns thereto. Thus, a pulse signal is constantly circulated. Each of the output terminals Q2 through Q15 generates a pulse signal whose period is equal to a period of time 32 times the time of the inversion operation Td at each of the inverting circuits (32.Td).

A description will now be made of the pulse phase difference encoding circuit 64 which converts a phase difference between determination signals Pout (period) into digital data Dout using the above-described ring oscillator 62.

Figure 11:
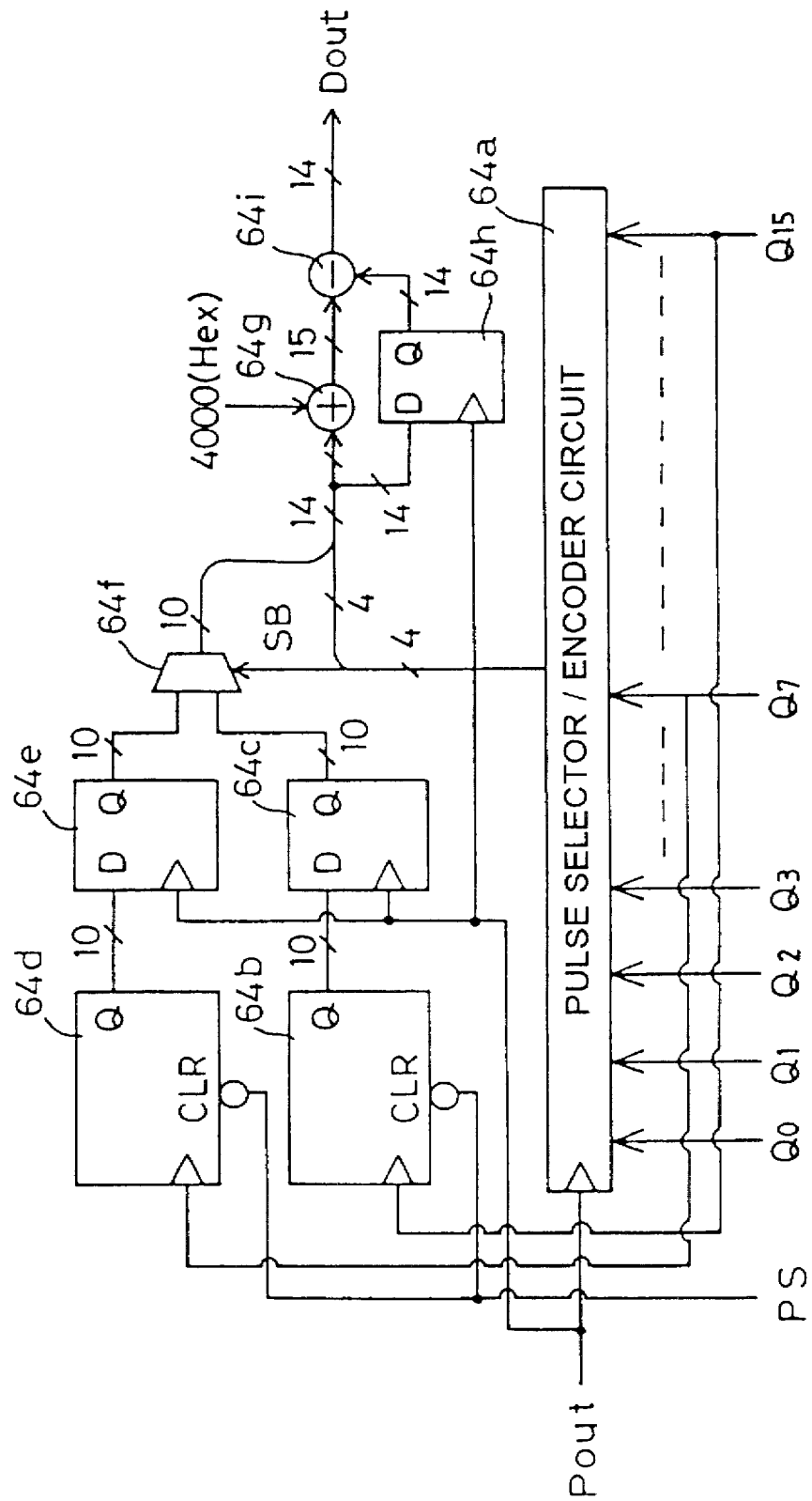
FIG. 11 illustrates a configuration of a pulse phase difference encoding circuit in a clock generation circuit.

As shown in FIG. 11, the pulse phase difference encoding circuit 64 in the clock generation circuit 60 comprises a pulse selector/encoder circuit 64a which receives the output signals of the output terminals Q0 through Q15 of the ring oscillator 62, detects the inverting circuit in the ring oscillator 62 at which the main edge has arrived when the determination signal Pout changes from the low level to the high level (the timing at which a rise of the determination signal Pout occurs) and encodes such a position into digital data consisting of four bits (D0 through D3), a first counter 64b which counts how many times the main edge has been circulated in the ring oscillator 62 from the output P32 of the NAND gate NAND32 in the ring oscillator 62 output from the output terminal Q15, a first latch circuit 64c which latches the output consisting of 10 bits from the first counter 64b at the timing at which a rise of the determination signal Pout occurs, a second counter 64d which counts how many times the main edge has been circulated in the ring oscillator 62 from the output P16 of the inverter INV16 in the ring oscillator 62 output from the output terminal Q7, a second latch circuit 64e which latches the output consisting of 10 bits from the second counter 64d at the timing at which a rise of the determination signal Pout occurs, a multiplexer 64f to which the output consisting of 10 bits from each of the first latch circuit 64c and the second latch circuit 64e is input and which selects the output consisting of 10 bits from either the first latch circuit 64c or the second latch circuit 64e based on the value of the most significant bit (MSB) of the 4-bit digital data (D0 through D3) output by the pulse selector/encoder circuit 64a and outputs it as high order bit data (D4 through D13) for the 4-bit digital data (D0 through D3) output by the pulse selector/encoder circuit 64a, an adder 64g which adds high order bit data D14 having a value of 1 (4000H) to a 14-bit digital data (D0 through D13) consisting of the 10-bit digital data (D4 through D13) from the multiplexer 64f and the 4-bit digital data (D0 through D3) from the pulse selector/encoder circuit 64a and outputs the result as 15-bit digital data (D0 through D14), a data latch circuit 64h which latches the above-described 14-bit digital data (D0 through D13) at the timing at which a rise of the determination signal Pout occurs, and a subtracter 64i which subtracts the digital data (D0 through D13) latched by the data latch circuit 64h at the timing of the previous rise of the determination signal Pout from the 15-bit digital data (D0 through D14) output by the adder 64g to generate digital data Dout representing the period between a rise of the determination signal Pout and the next rise thereof (the period of the determination signal Pout).

Figure 12:
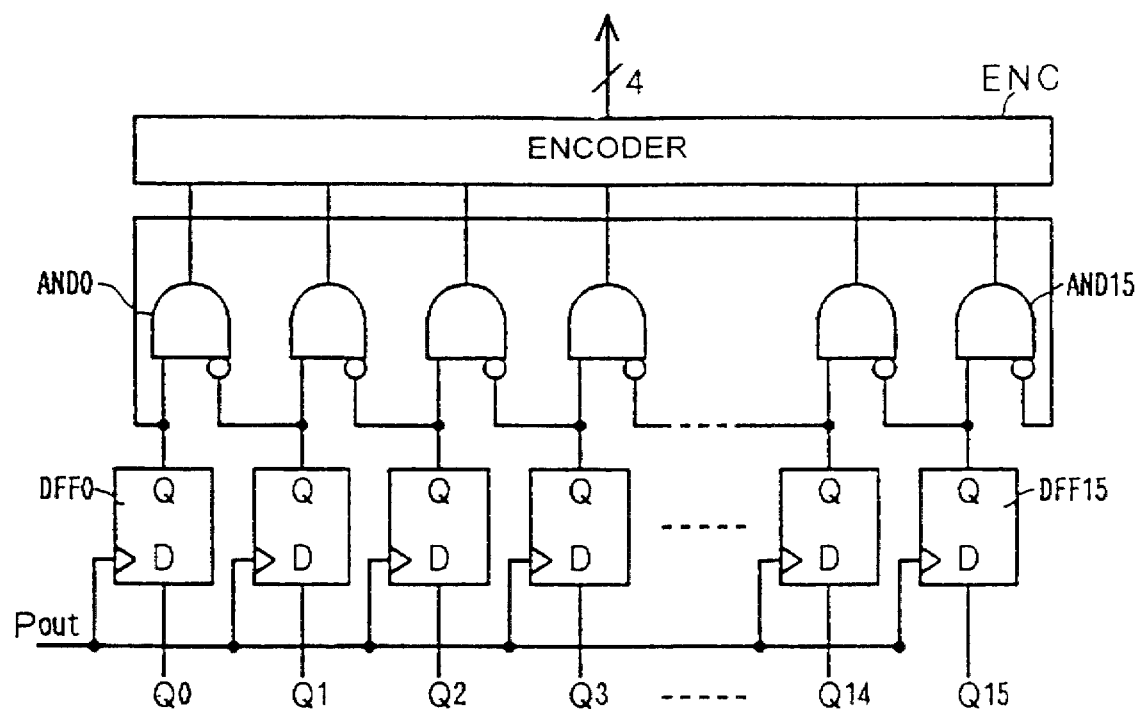
FIG. 12 illustrates a configuration of the pulse selector/encoder circuit in FIG. 11.

As shown in FIG. 12, the pulse selector/encoder circuit 64a comprises D flip-flops DFF0 through DFF15 which have input terminals D to which the output terminals Q0 through Q15 of the ring oscillator 62 are respectively connected and which latch the levels of the signals at the output terminals Q0 through Q15, respectively, at a rise of the determination signal Pout, AND gates AND0 through AND15 to which the output of D flip-flops DFF0 through DFF15 is input as it is at the respective group of input terminals and to which the output of the subsequent D flip-flops DFF1 through DFF15 and DFF0 is input after being inverted at another group of input terminals, and an encoder ENC which encodes the position of an AND gate ANDn whose output level is high from among the AND gates AND0 through AND15 into 4-bit digital data (D0 through D3).

Figure 13:
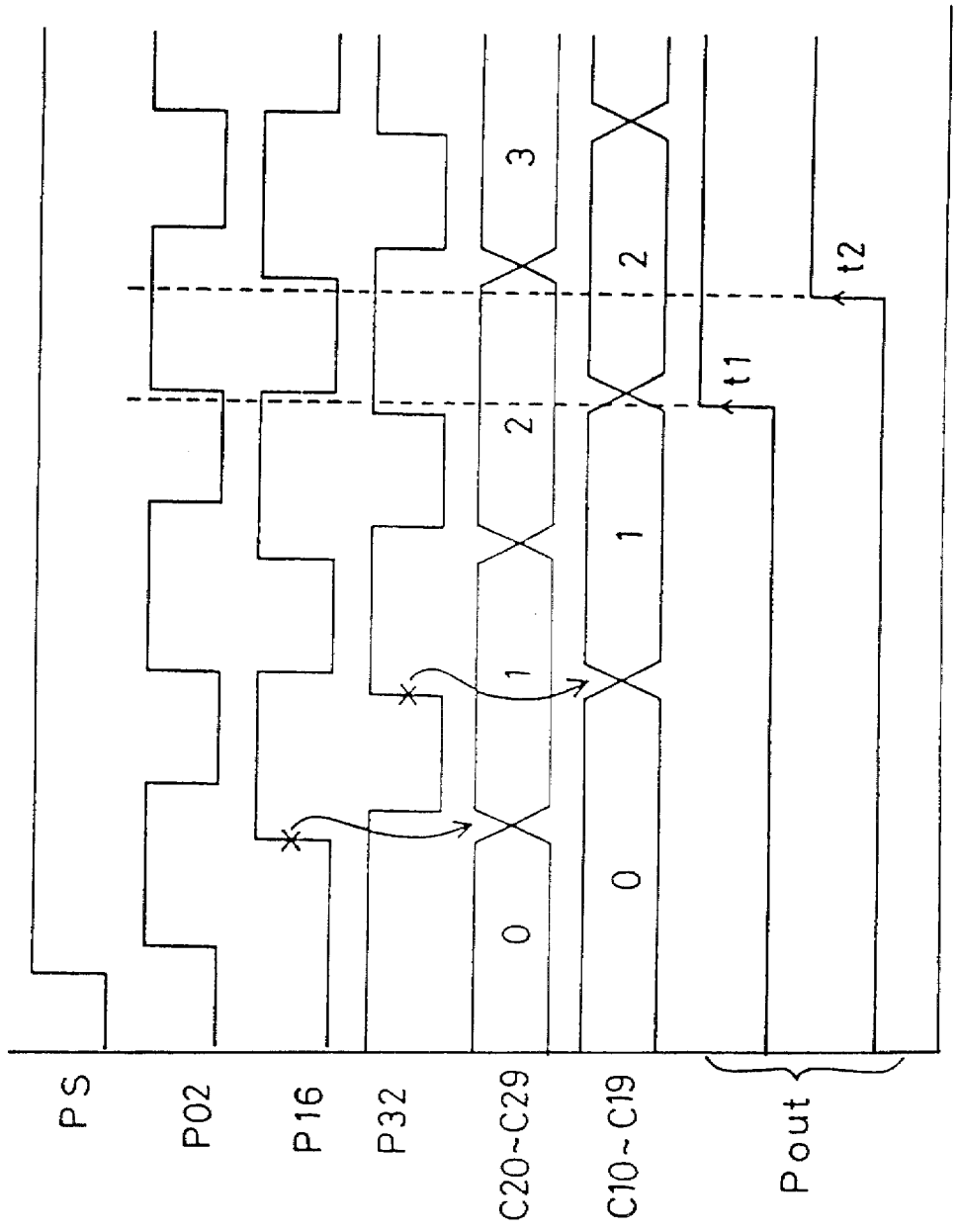
FIG. 13 is a time chart illustrating the operation of the pulse phase difference encoding circuit in the clock generation circuit.

In the pulse phase difference encoding circuit 64 having such a configuration, as shown in FIG. 13, the counters 64b and 64d are enabled for counting when the ring oscillator 62 is activated by the control signal PS to start circulating a pulse signal; the second counter 64d counts up when the main edge passes through the inverter INV16 at the 16 th stage of the ring oscillator 62; and the first counter 64b counts up when the main edge passes through the NAND gate NAND32 at the 32 th stage of the ring oscillator 62. Specifically, as shown in FIG. 13, the timing at which output of the first counter 64b (C10 through C19) varies is shifted from the timing at which the output of the second counter 64d (C20 through C29) varies by a period of time required for the main edge to go a half cycle in the ring oscillator 62.

If a rise of the determination signal Pout occurs while the ring oscillator 62 is operating in such a circulating mode, the first latch circuit 64c latches the output of the first counter 64b (C10 through C19) and the second latch circuit 64e latches the output of the second counter 64d (C20 through C29).

On the other hand, when a rise of the determination signal Pout occurs as described above, a clock is supplied to the D flip-flops DFF0 through DFF15 in the pulse selector/encoder circuit 64a. The D flip-flops DFF0 through DFF15 latch and output the signal levels at the output terminals Q0 through Q15 of the ring oscillator 62 at that time.

For example, when the determination signal Pout rises at timing t1 as shown in FIG. 13, i.e., when the main edge is at the NAND gate NAND32 at the 32 th stage, because the output signal of the ND gate NAND32 has been changed to the high level but the output signal of the inverter INV2 at the second stage is still at the low level, only the output of the rightmost AND gate AND15 from among the AND gates AND0 through AND15 shown in FIG. 11 is output to the encoder ENC.

Specifically, the pulse signal output by an inverter at an even-numbered stage in the ring oscillator 62 is input to the D flip-flops DFF0 through DFF15 of the pulse selector/encoder circuit 64a. Since this signal rises at the main edge and falls at the reset edge, the output of a D flip-flop DFFn among the D flip-flops DFF0 through DFF15 which latches the output from an inverting circuit in the ring oscillator 62 at which the main edge has arrived becomes the high level while the output of the next D flip-flop DFF(n+1) becomes the low level. In the configuration of the present embodiment the output of each of two consecutive D flip-flops among the D flip-flops DFF0 through DFF15 is input to the AND gates AND0 through AND15; only the output of an AND gate ANDn associated with a D flip-flop DFFn the output of which is at the high level and which is followed by a D flip-flop DFF(n+1) whose output is at the low level becomes the high level; and the signal of such an AND gate is output to the encoder ENC to allow the encoder ENC to generate digital data (D0 through D3) representing the position of the inverting circuit at which the main edge has arrived in the ring oscillator 62. For example, if the determination signal Pout rises when the main edge has arrived at the NAND gate NAND32 at the 32nd stage to render the output level of the AND gate AND15 high as described above, the encoder ENC outputs digital data (1111) which is a binary number obtained by encoding a value 15 corresponding to the position of the AND gate.

Further, in the pulse phase difference encoding circuit 64, the MSB of the digital data (D0 through D3) output by the pulse selector/encoder circuit 64a, i.e., D3, is input to the multiplexer 64f. The multiplexer 64f outputs the 10-bit output of the first latch circuit 64c (C10 through C19) as 10-bit digital data (D4 through D13) if the value of D3 is 1 and outputs the 10-bit output of the second latch circuit 64e (C20 through C29) as 10-bit digital data (D4 through D13) if the value of D3 is 0.

For example, when the determination signal Pout rises at the timing t1 shown in FIG. 13, the main edge has arrived at the NAND gate NAND32 at the 32nd stage of the ring oscillator 62. Then, the value of D3 output by the pulse selector/encoder circuit 64a is 1. In this case, the 10-bit output of the first latch circuit 64c (C10 through C19) is selected, and the multiplexer 64f outputs (0000000001). When the determination signal Pout rises at the timing t2 shown in FIG. 13, the main edge has already passed through the inverter INV2 at the second stage of the ring oscillator 62 and has not arrived at the inverter INV16 at the 16 th stage. Then, the value of D3 output by the pulse selector/encoder circuit 64a is 0. In this case, the 10-bit output of the second latch circuit 64e (C20 through C29) is selected, and the multiplexer 64f outputs (0000000010).

As described above, in the pulse phase difference encoding circuit 64, the two counters 64b and 64d and two latch circuits 64c and 64e are provided, and the multiplexer 64f selects the output of the second latch circuit 64e if the value of the MSB of the digital data (D0 through D3) output by the pulse selector/encoder circuit 64a is 0 and selects the output of the first latch circuit 64c if the value of the MSB of the digital data (D0 through D3) is 1. This is because it takes a certain period of time before the output of the counters 64b and 64d is stabilized. With such an arrangement, a stable and accurate count value is always output by the multiplexer 64f by selecting the counter to which the output signal of the inverting circuit preceding the position of the main edge at the time of a rise of the determination signal Pout by at least a half cycle of the ring oscillator 62 is input as a clock.

Next, the 10-bit digital data (D4 through D13) output by the multiplexer 64f as described above along with the 4-bit digital data (D0 through D3) output by the pulse selector/encoder circuit 64a are input to the adder 64g and the data latch circuit 64h as 14-bit digital data (D0 through D13). The adder 64g adds high order bit data D14 having a value of 1 (=4000(HEX)) to this 14-bit digital data (D0 through D13) and outputs 15-bit digital data (D0 through D14) as a result of such addition to the subtracter 64i.

The data latch circuit 64h latches the 14-bit digital data (D0 through D13) input by the pulse selector/encoder circuit 64a and the multiplexer 64f each time the determination signal Pout rises and outputs the latched digital data (D0 through D13) to the subtracter 64i.

Since the data latched by the data latch circuit 64h at this time is digital data (D0 through D13) which has been already output by the multiplexer 64f and the pulse selector/encoder circuit 64a at the time of a rise of the determination signal Pout, the data is the digital data (D0 through D13) which has been generated by the multiplexer 64f and the pulse selector/encoder circuit 64a at the time of the previous rise of the determination signal Pout (i.e., in the preceding cycle). Normally, the digital data (D0 through D13) of the determination signal Pout latched by this data latch circuit 64h in the preceding cycle and the 15-bit digital data (D0 through D14) which has been generated in the current cycle by a rise of the determination signal Pout and which has been added with the most significant bit D14 by the adder 64g are input to the subtracter 64i.

The subtracter 64i subtracts the digital data (D0 through D13) in the preceding cycle of the determination signal Pout input by the data latch circuit 64h from the latest digital data (D0 through D14) input by the adder 64g, calculates the difference, and outputs the result of the calculation as 14-bit digital data Dout representing the period of the determination signal Pout.

Specifically, in the pulse phase difference encoding circuit 64, the number of the circulations of the main edge in the ring oscillator 62 after the ring oscillator 62 is activated by the control signal PS; digital data representing the time of a rise of the determination signal Pout is generated each time the determination signal Pout rises from the result of the counting and digital data representing the position of the main edge in the ring oscillator 62 output by the pulse selector/encoder circuit 64a; and the difference between the latest digital data thus generated and the digital data which has been previously generated is output to the division circuit 66 as digital data Dout representing the period of the determination signal Pout.

When the subtracter 64i calculates the difference between the latest digital data generated at the timing of a rise of the determination signal Pout and the previously generated digital data, the adder 64g adds the most significant bit D14 having a value of 1 to the latest digital data to obtain 15-bit digital data. The reason is that the number of the circulations of a pulse signal in the ring oscillator 62 will otherwise return to the minimum value (=0) when the output value thereof reaches the maximum value (=3FFF(HEX)) because the number is continuously counted by the counters 64b and 64d.

Specifically, if the output of the counters 64b and 64d changes from the maximum value to the minimum value during the period between a rise of the determination signal Pout and the next rise of the same, the previous digital data (D0 through D13) latched by the data latch circuit 64h exceeds the latest digital data (D0 through D13) obtained by the multiplexer 64f and the pulse selector/encoder circuit 64a. If the subtraction is performed on those data as they are, the result will be a negative value. According to the present embodiment, digital data Dout corresponding to the period of the determination signal Pout is always obtained by adding the most significant bit data D14 having a value of 1 to the latest digital data (D0 through D13) to generate 15-bit digital data (D0 through D14), by subtracting the digital data (D0 through D13) latched by the data latch circuit 64h from this value, and by outputting only the 14 low order bits of the result of the subtraction.

Next, the digital data Dout representing the period of the determination signal Pout obtained by the pulse phase difference encoding circuit 64 as described above is divided by a predetermined value (32 in the present embodiment) at the division circuit 66 and the result is output as control data Din (14 bits) for the digitally controlled oscillation circuit 68. Upon the receipt of the control data Din, the digitally controlled oscillation circuit 68 outputs a pulse signal (oscillation signal) CKC in a cycle corresponding to the control data Din, i.e., a cycle obtained by dividing the period of the determination signal Pout by the predetermined value (32).

The configuration and operation of this digitally controlled oscillation circuit 68 will now be described.

Figure 14:
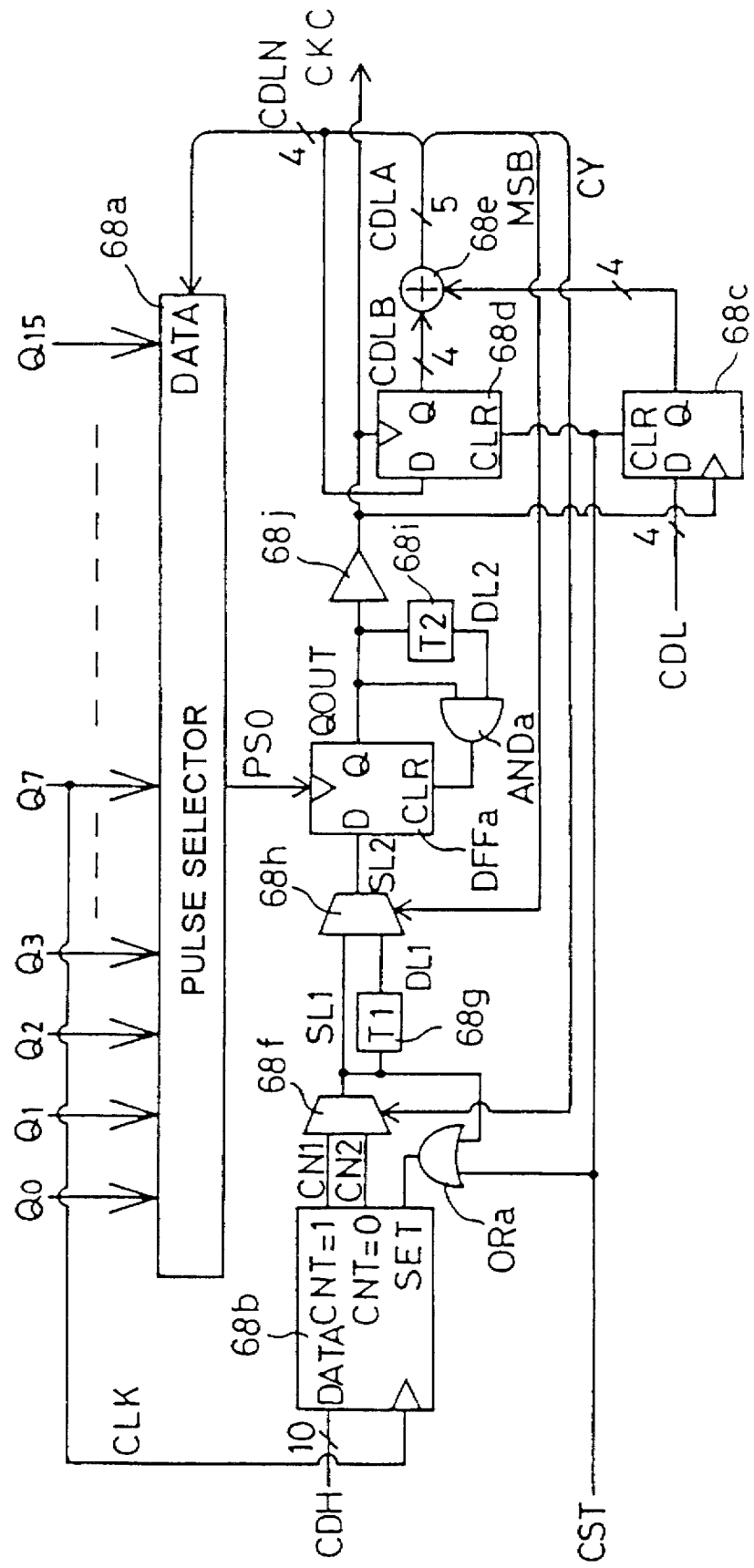
FIG. 14 illustrates a configuration of a digitally controlled oscillation circuit in the clock generation circuit.

As shown in FIG. 14, the digitally controlled oscillation circuit 68 in the present embodiment comprises a pulse selector 68a which receives signals from the output terminal Q0 through Q15 of the ring oscillator 62, selects the output signal of a predetermined output terminal corresponding to select data CDLN to be described later, and outputs the signal as a select signal PSO, a down counter 68b in which ten high order bits of the 14-bit control data Din input from the division circuit 66 are preset as counter data DinH and which counts at the timing of a rise of the output signal of the output terminal Q7 of the ring oscillator 62, renders the level of an output signal CN1 high if the count value DCD is 1, and renders the level of an output signal CN2 high if the count value DCD is 0, a latch circuit 68c which is reset by a reset signal CST input from the outside when the oscillation circuit 68 is activated and which latches four low order bits of the 14-bit control data Din input by the division circuit 66 at the timing of a rise of the clock signal CKC as reference select data CDL, a latch circuit 68d which is also reset by the reset signal CST input from the outside and which latches the select data CDLN which has been input to the pulse selector 68a at the timing of a rise of the clock signal CKC, and outputs the latched data as old select data CDLB, an adder 68e which adds the old select data CDLB output by the latch circuit 68D and the reference select data CDL output by the latch circuit 68C to generate 5-bit sum data CDLA, outputs four low order bits thereof to the pulse selector 68a and the latch circuit 68d as the above-described select data CDLN, and outputs the value of the fourth low order bit of the sum data CDLA (i.e., the most significant bit of the select data CDLN) as a signal MSB, a selector 68f which selects the output signal CN1 of the down counter 68b when a carry signal CY is at the low level, selects the output signal CN2 of the down counter 68b when the carry signal CY is conversely at the high level, and outputs the selected signal as an output signal SL1, the carry signal being the most significant bit of the 5-bit sum data CDLA output by the adder 68e, an OR gate ORa which ORs the above-described reset signal CST and the output signal SL1 of the selector 68f and outputs a signal representing the logical OR as a set signal for the down counter 68b, a delay line 68g which delays the output signal SL1 of the selector 68f by a time T1 required for a pulse signal to make a half cycle through the ring oscillator 62 and outputs a delayed signal DL1, a selector 68h which selects the output signal SL1 of the selector 68f when the signal MSB output by the adder 68e is at the low level, selects the output the delayed signal DL1 from the delay line 68g when the signal MSB is conversely at the high level, and outputs the selected signal as an output signal SL2, a D flip-flop DFFa having a clear terminal which latches the output signal SL2 of the selector 68h at the timing of the rise of the select signal PSO output by the pulse selector 68a and outputs a latch signal QOUT, a delay line 68i which delays the latch signal QOUT from the D flip-flop DFFa by a predetermined time T2 and outputs a delayed signal DL2, and an AND gate ANDa which ANDs the delayed signal DL2 output by the delay line 68i and the latch signal QOUT from the D flip-flop DFFa and outputs a signal representing the logical AND as a clear signal for the D flip-flop DFFa, and an amplifier 68j which amplifies the latch signal QOUT from the D flip-flop DFFa and outputs it as the clock signal CKC.

The output signals from the output terminals Q0 through Q15 provided at the ring oscillator 62 are input to the pulse selector 68a and, from among those signals, the pulse selector 68a selects and outputs the signal which is assigned a number corresponding to the select data CDLN which is the four low order bits of the sum data CDLA (5 bits) generated by the adder 68e. For example, the pulse selector 68a outputs the output signal of the output terminal Q1 as the select signal PSO if the select data CDLN is "0001" representing a value of 1 and outputs the output signal of the output terminal Q15 as the select signal PSO if the select data CDLN is "1111" representing a value of 15.

The down counter 68b is a known counter having a set terminal SET to which the set signal from the OR gate ORa is input. If the signal from the output terminal Q7 of the ring oscillator 62 (hereinafter also referred to as a clock signal CLK) rises when this set signal is at the high level, ten high order bits of the control data Din are preset as the count data CDH. On the other hand, when the set signal is at the low level, the count value DCD is decremented by one each time the clock signal CLK from the ring oscillator 62 rises to render the level of the output signal CN1 high when the count value DCD is 1 and to render the level of the output signal CN2 high when the count value DCD is 0.

The operation of the digitally controlled oscillation circuit 68 having the above-described configuration will now be described.

First, this oscillation circuit 68 is initialized by keeping the reset signal CST at the high level for a predetermined period of time to preset ten high order bits of the control data Din in the down counter 68b as the count data CDH at the timing of a rise of the clock signal CLK and by resetting the latch circuits 68c and 68d to clear the internal data.

In this initialized state, since the latch circuits 68c and 68d are reset, all of the 4-bit data output by the latch circuits 68c and 68d become zero and all of the 5-bit sum data CDLA output by the adder 68e also become zero. Therefore, in this initialized state, "0000" representing a value of 0 is input to the pulse selector 68a as the select data CDLN, and the pulse selector 68a outputs the output signal of the output terminal Q0 of the ring oscillator 62 as the select signal PSO. Further, in this initialized state, since the SET terminal of the down counter 68b is at the high level, ten high order bits of the control data Din are preset in the down counter 68b as the count data CDH at the timing of a rise of the clock signal CLK from the ring oscillator 62.

Thereafter, when the reset signal CST becomes the low level, the down counter 68b starts a counting operation to sequentially count down the preset count data CDH each time the clock signal CLK from the ring oscillator 62 rises. However, since all the 5-bit sum data CDLA output by the adder 68e are zero at this time, a low level signal is input to each of the selectors 68f and 68h. Then, the selector 68f selects the output signal CN1 of the down counter 68b and outputs the output signal SL1 while the selector 68h selects the output signal SL1 of the selector 68f and outputs the output signal SL2.

Figure 15:
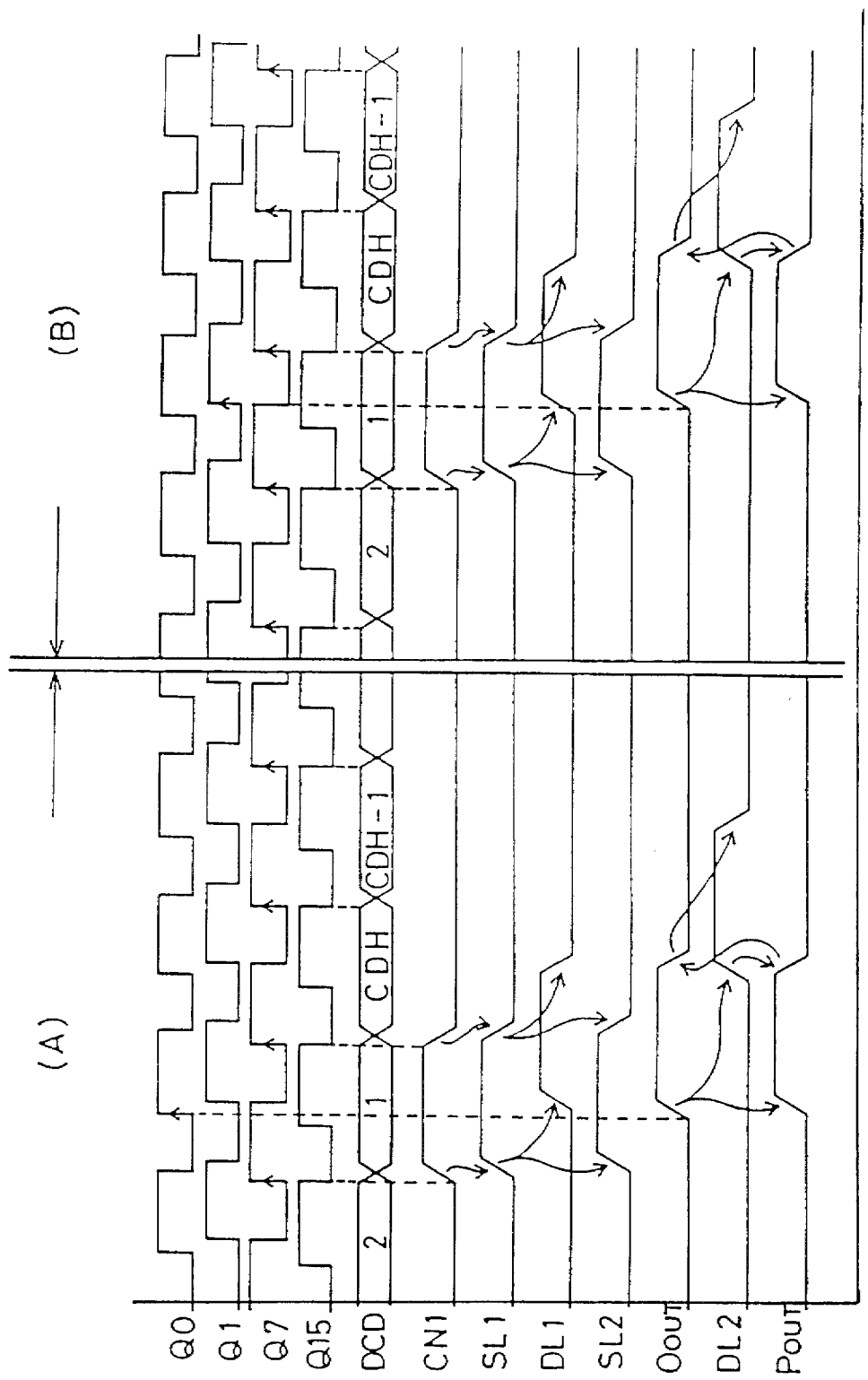
FIG. 15 is a time chart illustrating the operation of the digitally controlled oscillation circuit.

As a result, immediately after the reset signal CST is switched from the high level to the low level (i.e., immediately after the activation), the input terminals D of the D flip-flops DFFa become the high level when the count value DCD in the down counter 68b is 1 as seen in the period (A) shown in FIG. 15. When the output of the output terminal Q0 of the ring oscillator 62 becomes the high level in such a state to cause the select signal PSO to be output from the pulse selector 68a, a first clock signal CKC is output from the oscillation circuit 68.

After outputting a latch signal QOUT (high level), the D flip-flop DFFa is cleared through the AND gate ANDa when a delayed signal DL2 from the delay line 68i delaying the latch signal QOUT by the predetermined time T2 has become the high level. Therefore, the latch signal QOUT and hence the pulse width of the clock signal CKC match the delay time T2 of the delay line 68i, and the oscillation circuit 68 outputs a clock signal CKC having a predetermined pulse width.

When the first clock signal CKC is output after the activation of the oscillation circuit 68 as described above, the latch circuit 68c latches the four low order bits of the control data Din as reference select data CDL and the latch circuit 68d latches the select data CDLN which is currently being input to the pulse selector 68a as old select data CDLB at the timing of the rise of this clock signal CKC. As a result, the sum data CDLA output by the adder 68e is updated to a value obtained by adding four low order bits of the control data Din (reference select data CDL) and four low order bits of the current sum data CDLA (old select data CDLB whose value is 0 in this case). At this time, since the carry signal CY of the sum data CDLA output by the adder 68e is 0, the selector 68f continues to select the output signal CN1 of the down counter 68b.

On the other hand, since the output signal SL1 of the selector 68f is input to the set terminal SET of the down counter 68b, when the clock signal CLK from the ring oscillator 62 rises after the output signal SL1 of the selector 68f becomes the high level, ten high order bits of the control data Din are set again as the count data CDH in the down counter 68b and the counting operation is resumed at the timing of the next rise of the clock signal CLK.

The down counter 68b resumes the counting operation as described above. When the count value DCD becomes 1 and the output signal CN1 becomes the high level, the output signal SL1 of the selector 68f and the output signal SL2 of the selector 68h sequentially become the high level as seen in the period (B) shown in FIG. 15.

At this time, the pulse selector 68a selects the output signal of the ring oscillator 62 in accordance with four low order bits of the sum data CDLA output by the adder 68e (i.e., the select data CDLN). For example, it selects the output signal of the output terminal Q1 of the ring oscillator 62 as seen in the period (B) shown in FIG. 15 if four low order bits of the control data Din latched by the latch circuit 68c as the reference select data CDL are "0001" which indicates a value of 1 and the sum data CDLA output by the adder 68e has become "00001".

In this case, therefore, when the output signal of the output terminal Q1 rises after the output signal SL2 of the selector 68h becomes the high level, the output signal QOUT of the D flip-flop DFFa becomes the high level and a second clock signal CKC is output by the oscillation circuit 68.

When the second clock signal CKC is output by the oscillation circuit 68 as described above, the latch circuit 68d latches again the select data CDLN which is currently being input to the pulse selector 68a as old select data CDLB while the latch circuit 68c latches again four low order bits of the control data Din as reference select data CDL. Therefore, if the four low order bits of the control data Din are still "0001", the sum data CDLA output by the adder 68e is updated to "00010". Thereafter, each time a clock signal CKC is output, the sum data CDLA is updated by having added thereto four low order bits of the control data Din (reference select data CDL) latched by the latch circuit 68c.

Next, for example when sum data CDLA "01111" is output by the adder 68e as a result of the repetition of the above-described operation and the MSB which is the fourth low order bit thereof becomes the high level, the pulse selector 68a selects the output signal of the output terminal Q15 of the ring oscillator 62 and the selector 68h selects a delayed signal DL1 from the delay line 68g which delays the output signal SL1 of the selector 68f by the time T1 required for a pulse signal to make a half cycle through the ring oscillator 62.

In this case, therefore, when the count value DCD in the down counter 68b becomes 1 and the output signal CN1 thereof becomes the high level, the output signal SL1 of the selector 68f becomes the high level and, after the time T1 elapses, the output signal SL2 of the selector 68h becomes the high level. When the output signal of the output terminal Q15 of the ring oscillator 62 rises thereafter, the output signal QOUT of the D flip-flop DFFa becomes the high level, and the next clock signal CKC is output from the oscillation circuit 68.

The reason is that when the pulse selector 68a selects the output signal of any one of the output terminals Q8 through Q15, the D flip-flop DFFa latches the data immediately after the input data becomes the high level, which results in a danger of the output signal QOUT from the D flip-flop DFFa becoming uncertain.

In summary, the output signal SL1 of the selector 68f is input to the D flip-flop DFFa as it is when the pulse selector 68a selects the output signal of any one of the output terminals Q0 through Q7 while the output signal SL1 of the selector 68f is delayed by the time T1 required for a pulse signal to make a half cycle through the ring oscillator 62 before it is input to the D flip-flop DFFa when the pulse selector 68a selects the output signal of any one of the output terminals Q8 through Q15. This makes it possible to always keep the time required for the D flip-flop DFFa to latch data input thereto after the data becomes the high level equal to or longer than the time required for a pulse signal to make a half cycle through the ring oscillator 62.

Next, the selector 68f selects the output signal CN2 which becomes the high level when the count value DCD in the down counter 68*b* is 0 when the carry signal CY of the sum data CDLA output by the adder 68*e* becomes the high level. In this case, therefore, a clock signal CKC is output at the rise of a select signal PSO output by the pulse selector 68*a* after the number of the circulations of a pulse signal in the ring oscillator 62 reaches the number obtained by adding 1 to ten high order bits of the control data Din.

The reason is that the oscillation cycle will be shortened by the time required for a pulse signal to make one cycle through the ring oscillator 62 if the output terminal of the ring oscillator 62 at which the current pulse signal is obtained is at a stage preceding the output terminal at which the previous pulse signal was obtained, i.e., when the value of the select data CDLN input to the pulse selector 68*a* is smaller than the previous value because the down counter 68*b* counts down in a constant cycle (32.Td) in accordance with the clock signal CLK output by the output terminal Q7 of the ring oscillator 62.

As described above, in the digitally controlled oscillation circuit 68, the number of circulations of a pulse signal in the ring oscillator 62 is counted from the count data CDH which are ten high order bits of the control data Din output by the division circuit 66; the output signal of the ring oscillator 62 is selected based on four low order bits (select data CDLN) of the 5-bit sum data CDLA obtained by sequentially adding the reference select data CDL which are four low order bits of the control data Din; and the counted number of circulations of the pulse signal is increased or decreased according to the carry signal CY of the sum data CDLA. As a result, the clock signal CKC is repeatedly output in a constant cycle (=CDH×32.Td+CHL×2.Td) determined by the control data Din and the inverting time Td of the inverting circuits in the ring oscillator 62.

As described above, in the clock generation circuit 60 in the present embodiment, the period of the determination signal Pout output by the comparison circuit 50 is converted into the digital data Dout by the pulse phase difference encoding circuit 64; this value is divided by the division circuit 66 by a predetermined value (32) to generate the control data Din; and the control data Din is input to the digitally controlled oscillation circuit 68 which outputs the clock signal CKC in synchronization in accordance with the control data Din. The pulse phase difference encoding circuit 64 and the digitally controlled oscillation circuit 68 are both operated in accordance with delayed signals from the output terminals Q0 through Q15 of the ring oscillator 62.

Therefore, the time resolution of the digital data Dour obtained by the pulse phase difference encoding circuit 64 and the clock signal CKC output by the digitally controlled oscillation circuit 68 provides a constant delay time (2.Td) determined by the inverting time of the inverting circuits between the output terminals Q0 through Q15 of the ring oscillator 62. Thus, the clock generation circuit 60 outputs a clock signal CKC which is an extremely accurate multiple of the determination signal Pout.

Figure 16:
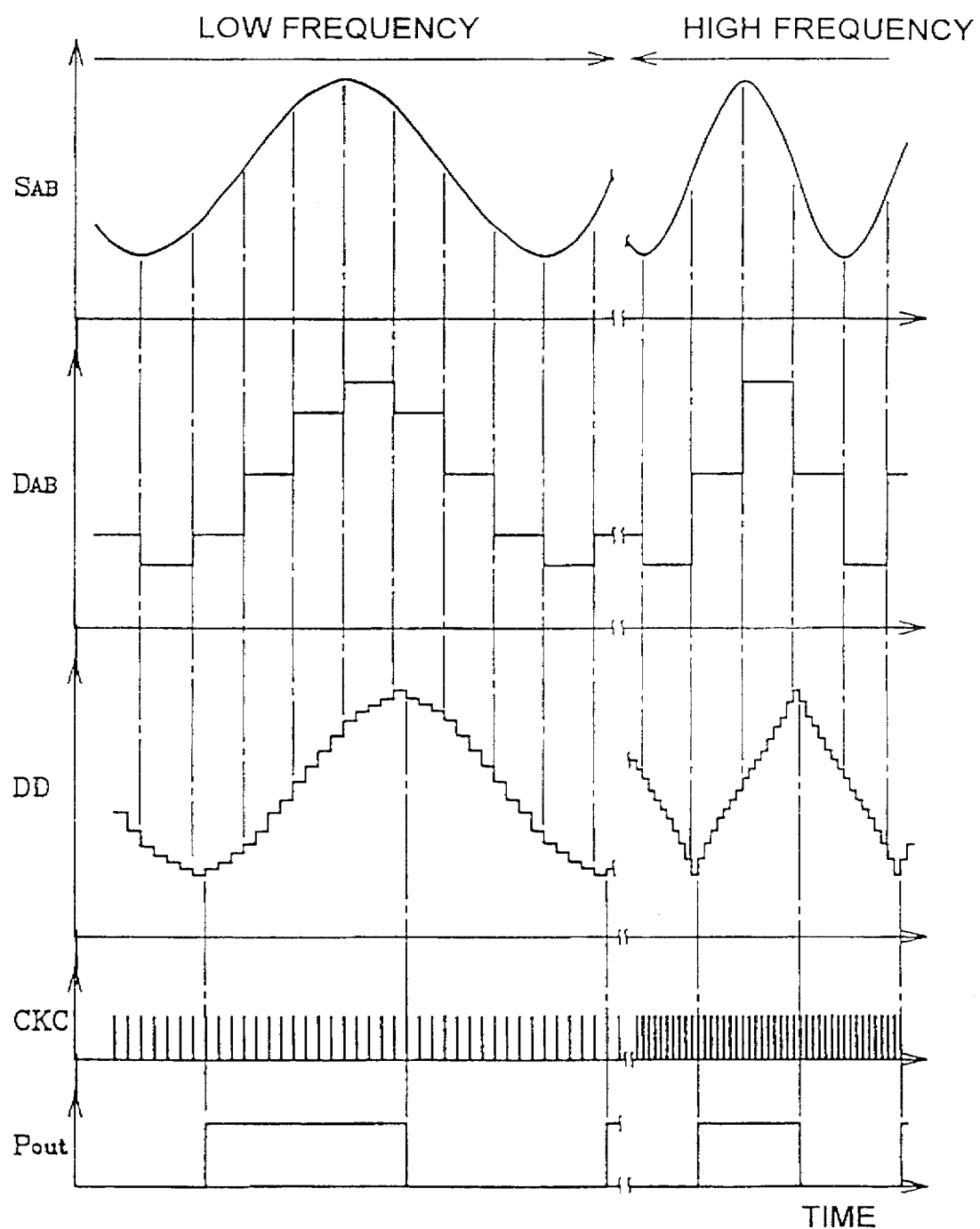
FIG. 16 is a time chart illustrating the operation of the physical quantity detecting device according to the second embodiment.

In the present embodiment, the clock signal CKC obtained by frequency-multiplying the determination signal Pout output by the clock generation circuit 60 is input to the interpolation circuit 40 and comparison circuit 50. Therefore, as shown in FIG. 16, it is possible to determine increases and decreases in the strength of magnetism SAB a predetermined number of times (32 times in the present embodiment) per one period of the change in the strength of magnetism SAB regardless of the frequency of the change. Thus, the present embodiment allows the determination of increases and decreases in the strength of magnetism SAB by the comparison circuit 50 to be always performed with constant accuracy. This makes it possible to prevent the accuracy of determination from being reduced when the frequency of the change in the strength of magnetism SAB becomes short.

Although FIG. 16 shows that the digital data DAB is generated in a predetermined cycle as in FIG. 6, the sample cycle of the digital data DAB varies depending on the cycle in which the pulse signal CKB is output. So, the cycle of the digital data DAB becomes shorter the greater the strength of magnetism SAB. Therefore, like FIG. 6, FIG. 16 has been prepared for easier understanding of the operation of the physical quantity detecting device according to the present embodiment, and the change in the digital data DAB and consequently the change in the digital data DD are different from those which actually occur.

Figure 17:
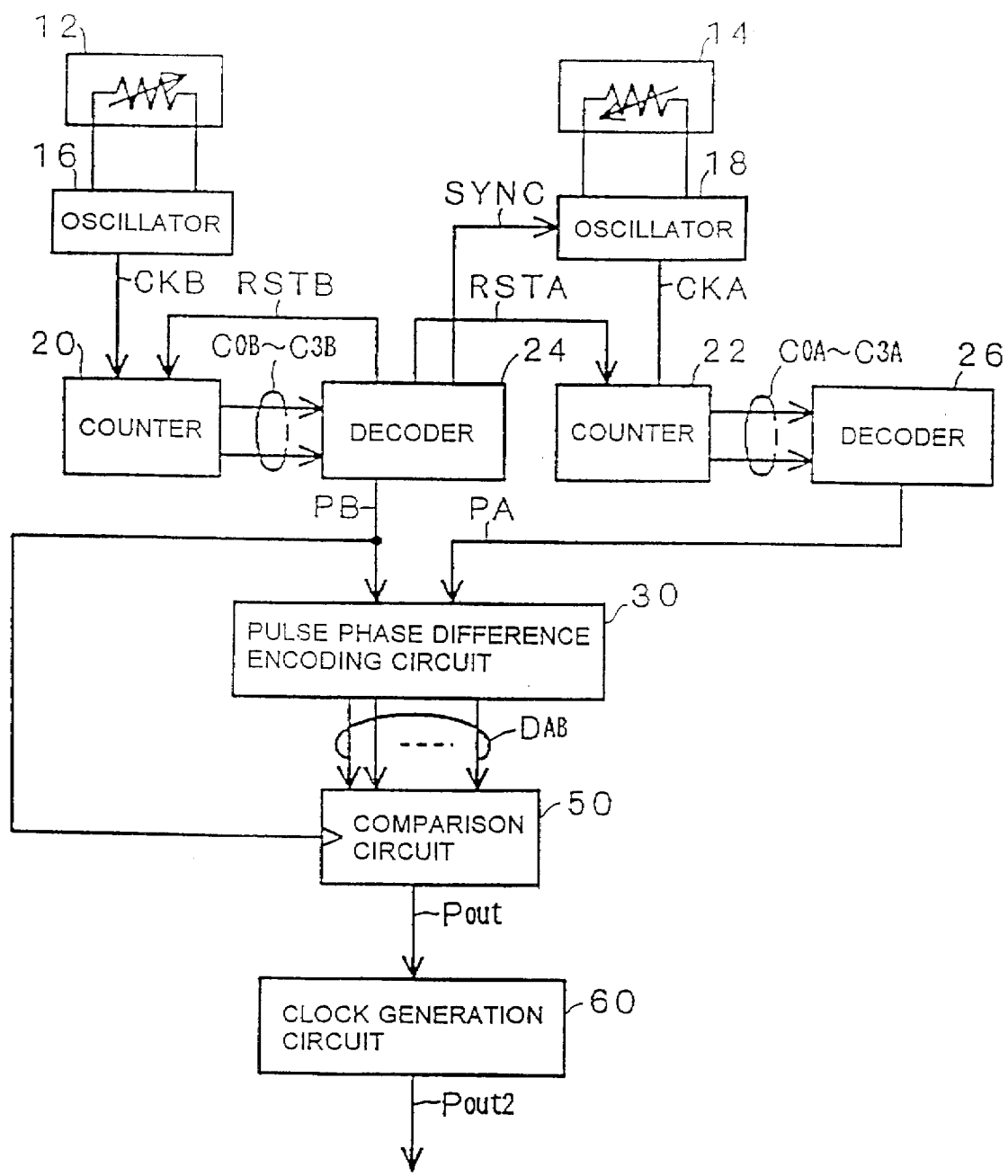
FIG. 17 is a block diagram showing an overall configuration of a physical quantity detecting device according to a third embodiment of the present invention.

A physical quantity detecting device has been described as the second embodiment of the present invention, wherein a clock signal CKC which is a multiple of a determination signal Pout is generated by the clock generation circuit 60 to be used as a sampling signal for the interpolation circuit 40 to improve accuracy in determining increases and decreases in the strength of magnetism. In such a physical quantity detecting device wherein increases and decreases in the strength of magnetism are determined using the comparison circuit 50, the clock signal CKC from the clock generation circuit 60 which is a multiple of the determination signal Pout from the comparison circuit 50 may be directly output to the outside as a determination signal Pout2 without using the interpolation circuit 40 as in a third embodiment of the present invention shown in FIG. 17.

When the physical quantity detecting device according to the above-described first or second embodiment is used as a rotary encoder for detecting the rotational position or speed of the rotational axis or an engine or the like, the number of teeth or the like of the pulser for detecting changes in magnetism provided on the rotational axis to be detected must be increased to improve detecting accuracy. However, there is a physical limitation on the increase in the number of the teeth. If the determination signal Pout output by the comparison circuit 50 is multiplied by the clock generation circuit 60, however, the inversion frequency of the determination signal Pout can be increased in accordance with the number of multiplier. This results in a determination signal Pout 2 output by the clock generation circuit 60 whose resolution per revolution has been improved from that of the determination signal Pout. This allows accuracy in detecting the rotational angle and rotational speed to be improved.

As described above, the physical quantity detecting device according to the present embodiment makes it possible to improve accuracy in detecting rotational position, rotational speed or the like without using the interpolation circuit 40.

The configurations of components of the physical quantity detecting device of the third embodiment are completely the same as those in the second embodiment except that the clock signal CKC generated by the clock generation circuit 60 is output to the outside as a determination signal Pout 2 as described above and that the pulse signal PB is input to the comparison circuit 50 as a sampling signal to synchronize the sampling circuit 50 with the sampling cycle of the pulse phase encoding circuit 30.

As preferred embodiments of the present invention, description has been made of physical quantity detecting devices wherein the strength of magnetism SAB detected by magnetic resistance elements 12 and 14 is converted into a phase difference between pulse signals PB and PA; the phase difference is converted into digital data; and a determination signal Pout is generated from an increase or decrease in the digital data to represent a change in the strength of magnetism. However, the present invention is not limited to such physical quantity detecting devices and may be applied to various physical quantity detecting devices.

For example, the cycle of the pulse signal PB output by the decoder 24 may be converted into digital data to be output as data representing the strength of magnetism SAB around the magnetic resistance element 12. Any detection element may be used as long as its electrical characteristics change with the physical quantity to be detected. For example, a Hall element may be used if the physical quantity to be detected is magnetism as in the above-described embodiments.

While specific illustrated embodiments have been shown and described, it will be appreciated by those skilled in the art that various modifications, changes and additions can be made to the invention without departing from the spirit and scope thereof as set forth in the following claims.

What is claimed is:

1. A physical quantity detecting device for detecting a physical quantity to be detected and for outputting a detection output signal representing the physical quantity, comprising:

a detection element whose characteristics change depending on said physical quantity to be detected;

a physical quantity-to-time base conversion circuit for generating a detection signal in a cycle in accordance with the characteristics of said detection element;

a time base amplifier circuit for multiplying the cycle of said detection signal for said physical quantity-to-time base conversion circuit by a predetermined value and for generating a pulse signal in said cycle obtained by the predetermined multiplication;

a time A-D conversion circuit for converting the cycle of said pulse signal output by said time base amplifier circuit into digital data and for outputting said converted digital data; and an interpolation circuit to which a sampling signal and said digital data output by said time A-D conversion circuit are input for interpolating said digital data in a sampling cycle and for sequentially outputting interpolated data, said interpolated data output by said interpolation circuit being output as said detection output signal representing said physical quantity;

wherein said detection signal output by said physical quantity-to-time base conversion circuit is input to said interpolation circuit as said sampling signal.

2. The physical quantity detecting device according to claim 1, wherein:

said physical quantity-to-time base conversion circuit comprises a detection signal output terminal for outputting said detection signal;

said interpolation circuit comprises a sampling signal input terminal to which said sampling signal is input; and said interpolation circuit further comprises a clock line for connecting said detection signal output terminal of said physical quantity-to-time base conversion circuit and said sampling signal input terminal.

3. A physical quantity detecting device for detecting a physical quantity to be detected and for outputting a detection output signal representing the physical quantity, comprising:

a detection element whose characteristics change depending on said physical quantity to be detected;

a physical quantity-to-time base conversion circuit for generating a detection signal in a cycle in accordance with the characteristics of said detection element;

a time base amplifier circuit for multiplying the cycle of said detection signal for said physical quantity-to-time base conversion circuit by a predetermined value and for generating a pulse signal in said cycle obtained by the predetermined multiplication;

a time A-D conversion circuit for converting the cycle of said pulse signal output by said time base amplifier circuit into digital data and for outputting said converted digital data; and an interpolation circuit to which a sampling signal and said digital data output by said time A-D conversion circuit are input for interpolating said digital data in a sampling cycle and for sequentially outputting interpolated data, said interpolated data output by said interpolation circuit being output as said detection output signal representing said physical quantity, wherein said time A-D conversion circuit converts the cycle of said pulse signal output by said time base amplifier circuit into said digital data in a first sampling cycle, and further comprising:

a determination circuit to which said interpolated data output by said interpolation circuit is input for determining increases and decreases in this interpolated data and for outputting a determination signal in a cycle in accordance with the cycle of transitions between the increases and decreases; and a clock signal generating circuit to which said determination signal output by said determination circuit is input for generating a clock signal having a second sampling cycle shorter than at least said first sampling cycle of said time A-D conversion circuit by dividing said cycle of said determination signal by a predetermined amount and for outputting this clock signal as said sampling signal input to said interpolation circuit.

4. A physical quantity detecting device for detecting physical quantity to be detected and for outputting a detection output signal representing the physical quantity, comprising:

a detection element whose characteristics change depending on said physical quantity to be detected;

a physical quantity-to-time base conversion circuit for generating a detection signal in a cycle in accordance with the characteristics of said detection element;

a time base amplifier circuit for multiplying the cycle of said detection signal for said physical quantity-to-time base conversion circuit by a predetermined value and for generating pulse signal in said cycle obtained by the predetermined multiplication;

a time A-D conversion circuit for converting the cycle of said pulse signal output by said time base amplifier circuit into digital data and for outputting said converted digital data; and an interpolation circuit to which a sampling signal and said digital data output by said time A-D conversion circuit are input for interpolating said digital data in a sampling cycle and for sequentially outputting interpolated data, said interpolated data output by said interpolation circuit being output as said detection output signal representing said physical quantity, wherein said time A-D conversion circuit further comprises a determination circuit for determining increases and decreases in said converted digital data and for outputting a determination signal in a cycle in accordance with the cycle of transitions between the increases and decreases and wherein said interpolation circuit receives the input of the determination signal output by said determination circuit as said digital data output by said time A-D conversion circuit, interpolated said determination signal in a sampling cycle in accordance with said sampling cycle and sequentially outputs interpolated data.

5. A physical quantity detecting device for detecting a physical quantity and for generating a detection output signal representing said physical quantity, said physical quantity detecting device comprising:

a detection element whose output varies with said physical quantity to be detected;

a physical quantity-to-time base converter for generating a detection signal in a cycle in accordance with the output of said detection element;

a time A/D converter for converting the cycle of said detection signal into digital data and for generating said digital data; and an interpolator for receiving said digital data generated by said time A/D converter and said detection signal generated by said physical quantity-to-time base converter, for interpolating said digital data with said cycle of said detection signal as a sampling cycle and for sequentially generating interpolated data based on said interpolating, wherein said physical quantity detecting device generates said interpolated data generated by said interpolator as the detection output signal that expresses said physical quantity.

6. A physical quantity detecting device for detecting a physical quantity and for generating a detection output signal representing said physical quantity, said physical quantity detecting device comprising:

a first detection element whose output changes with said physical quantity to be detected;

a second detection element whose output changes with said physical quantity to be detected in a way different from said output change of said first detection element;

a first physical quantity-to-time base converter which generates a first detection signal in a cycle which corresponds to the output of said first detection element;

a second physical quantity-to-time base converter which generates a second detection signal in a cycle which corresponds to the output of said second detection element, said second detection signal starting at the same time as said first detection signal;

a time A/D converter for detecting a difference between said cycle of said first detection signal and said cycle of said second detection signal, for converting said difference to digital data and for generating said digital data; and an interpolator for receiving said digital data generated by said time A/D converter and said first detection signal generated by said first physical quantity-to-time base converter, for interpolating said digital data with said cycle of said first detection signal as a sampling cycle and for sequentially generating interpolated data based on said interpolating, where said physical quantity detecting device generates said interpolated data generated by said interpolator as the detection output signal that expresses said physical quantity.

7. A physical quantity detecting device according to claim 6 said physical quantity detecting device further comprising:

a first time base amplifier for magnifying said cycle of said first detection signal from said first physical quantity-to-time base converter by a predetermined first multiple and for generating a first pulse signal at said cycle magnified by said first multiple; and a second time base amplifier for magnifying said cycle of said second detection signal from said second physical quantity-to-time base converter by a predetermined second multiple and for generating a second pulse signal at said cycle magnified by said second multiple, wherein said time A/D converter detects a cycle difference between said cycle of said first pulse signal and said cycle of said pulse signal second pulse signal and converts said cycle difference to digital data.

* * * * *